United States Patent
Sato et al.

(10) Patent No.: US 7,060,589 B2
(45) Date of Patent: Jun. 13, 2006

(54) METHOD FOR MANUFACTURING A SEMICONDUCTOR INTEGRATED CIRCUIT DEVICE THAT INCLUDES COVERING THE BOTTOM OF AN ISOLATION TRENCH WITH SPIN-ON GLASS AND ETCHING BACK THE SPIN-ON GLASS TO A PREDETERMINED DEPTH

(75) Inventors: Hidenori Sato, Ome (JP); Norio Suzuki, Mito (JP); Akira Takamatsu, Hamura (JP); Hiroyuki Maruyama, Ome (JP); Takeshi Saikawa, Ome (JP); Katsuhiko Hotta, Hachiouji (JP); Hiroyuki Ichizoe, Mizuho (JP)

(73) Assignees: Hitachi, Ltd., Tokyo (JP); Hitachi Ulsi Systems Co., Ltd., Tokyo (JP)

( * ) Notice: Subject to any disclaimer, the term of this patent is extended or adjusted under 35 U.S.C. 154(b) by 0 days.

(21) Appl. No.: 11/055,745

(22) Filed: Feb. 11, 2005

(65) Prior Publication Data

US 2005/0148155 A1 Jul. 7, 2005

Related U.S. Application Data

(63) Continuation of application No. 10/721,230, filed on Nov. 26, 2003, which is a continuation of application No. 09/709,403, filed on Nov. 13, 2000, now Pat. No. 6,693,008.

(30) Foreign Application Priority Data

Jan. 20, 2000 (JP) .............................. 2000-012026

(51) Int. Cl.
*H01L 21/762* (2006.01)
(52) U.S. Cl. ...................... 438/435; 438/781; 438/782
(58) Field of Classification Search ................ 257/510, 257/622, 635; 438/296, 424, 435, 763, 781, 438/782, 926

See application file for complete search history.

(56) References Cited

U.S. PATENT DOCUMENTS 5,098,856 A    3/1992 Beyer et al.

(Continued)

FOREIGN PATENT DOCUMENTS

EP    851463    7/1998

(Continued)

OTHER PUBLICATIONS

Tsuneo Ikura, "Manufacture of Semiconductor Device," English translation of JP 2000-183150 A, published Jun. 2000, JPO.*

Primary Examiner—Stephen W. Smoot
(74) Attorney, Agent, or Firm—Antonelli, Terry, Stout and Kraus, LLP.

(57) ABSTRACT

A method for manufacturing a semiconductor integrated circuit device includes the steps of forming an isolation trench in an isolation region of a semiconductor substrate, filling the isolation trench up to predetermined middle position in its depth direction with a first insulating film deposited by a coating method, filling a remaining depth portion of the isolation trench into which the first insulating film is filled with a second insulating film, then forming a plurality of patterns on the semiconductor substrate, filling a trench forming between the plurality of patterns up to predetermined middle position in a trench depth direction with a third insulating film deposited by a coating method, and filling a remaining portion of the trench into which the third insulating film is filled with a fourth insulating film that is more difficult to etch than the third insulating film. The method may also include the step of forming dummy patterns in a relatively large isolation region of isolation regions with relatively different planar dimensions before the first insulating film is deposited

13 Claims, 24 Drawing Sheets

U.S. PATENT DOCUMENTS

| | | |
|---|---|---|
| 5,539,240 A | 7/1996 | Cronin et al. |
| 5,665,643 A * | 9/1997 | Shin .......................... 438/763 |
| 5,827,782 A | 10/1998 | Shih |
| 6,027,983 A | 2/2000 | Hashimoto et al. |
| 6,060,352 A | 5/2000 | Sekiguchi et al. |
| 6,121,086 A | 9/2000 | Kuroda et al. |
| 6,133,105 A | 10/2000 | Chen et al. |
| 6,143,626 A | 11/2000 | Yabu et al. |
| 6,255,151 B1 | 7/2001 | Fukuda et al. |
| 6,258,649 B1 | 7/2001 | Nakumaura et al. |
| 6,261,883 B1 | 7/2001 | Koubuchi et al. |
| 6,337,282 B1 | 1/2002 | Kim et al. |
| 6,483,136 B1 | 11/2002 | Yoshida et al. |
| 2002/0182798 A1 | 12/2002 | Saito et al. |

FOREIGN PATENT DOCUMENTS

| | | |
|---|---|---|
| JP | 5-114646 | 5/1993 |
| JP | 5-235157 | 9/1993 |
| JP | 8-125008 | 5/1996 |
| JP | H11-145286 | 5/1999 |
| JP | 2000183150 A * | 6/2000 |
| KR | 1994-0004776 | 3/1994 |

* cited by examiner

METHOD FOR MANUFACTURING A SEMICONDUCTOR INTEGRATED CIRCUIT DEVICE THAT INCLUDES COVERING THE BOTTOM OF AN ISOLATION TRENCH WITH SPIN-ON GLASS AND ETCHING BACK THE SPIN-ON GLASS TO A PREDETERMINED DEPTH

This application is a Continuation Application of application Ser. No. 10/721,230, filed Nov. 26, 2003, which is a Continuation Application of application Ser. No. 09/709,403, filed Nov. 13, 2000, now U.S. Pat. No. 6,693,008, issued Feb. 17, 2004. The contents of application Ser. No. 09/709,403, filed Nov. 13, 2000, are incorporated herein by reference in their entirety.

FIELD OF THE INVENTION

This invention relates to a method of manufacturing a semiconductor integrated circuit device and to a semiconductor integrated circuit device; and, more particularly, the invention relates to a technology suitable for use in a method of manufacturing a semiconductor integrated circuit device having a trench isolation portion and which is also applicable to a semiconductor integrated circuit device having a trench isolation portion.

BACKGROUND OF THE INVENTION

Instead of element isolation technologies based on the local oxidization of silicon (LOCOS) method, a trench filled type element isolation technology has been developed which provides an increase in the capacity of the elements. According to such technology, after an isolation trench is formed on a semiconductor substrate by etching, an insulating film is deposited on a main surface of the semiconductor substrate by a CVD method. By filling the isolation trench, an element isolation portion is formed. To form the insulating film (or isolation film) for filling the isolation trench, for example, a mixture gas of tetraethoxysilane (TEOS) and ozone ($O_3$) may be used. Alternatively, the insulating film may be formed by causing decomposition reaction between monosilane and oxygen through use of a high-density plasma.

The technology is described in Japanese Patent Laid-open No. 235157/1993, which discloses a technology for filling an insulating film into field regions with different widths.

SUMMARY OF THE INVENTION

The present inventor has realized that a problem exists in the technology for filling the isolation trench. In this regard, with an increase in fineness of the insulation trench, the isolation trench can not be fully filled with the isolation film, leaving un-filled portions as holes. When flattening the isolation trench after the filling process, the holes left in the isolation trench are exposed to a surface of the isolation trench. Due to electrode material left in the holes during electrode formation thereafter, failures, such as a short between electrode wires, are caused. As a result, the reliability and yield of the semiconductor integrated circuit device are deteriorated.

It is an object of the present invention to provide a technology which makes it possible to fill an insulating film into an isolation trench fully without forming holes on top of the insulating film filled within the isolation trench.

Also, it is another object of the present invention to provide a technology which makes it possible to fill an insulating film into a trench formed between adjacent patterns fully without forming holes on top of the insulating film filled within the trench.

These and other objects and novel features of the present invention will be apparent from the description herein and the accompanying drawings.

Typical effects obtained by the present invention disclosed herein may be described simply as follows:

The present invention includes the step of filling an isolation trench formed on a semiconductor substrate by filling it up to a predetermined middle depth with an insulating film formed by a coating method and then stacking an insulating film thereon.

The present invention includes the step of filling an isolation trench formed on a semiconductor substrate by filling it up to a predetermined middle depth with an insulating film formed by a coating method and then stacking an insulating film formed by a chemical vapor deposition method thereon.

The present invention includes the step of filling a trench formed between adjacent patterns formed on a semiconductor substrate by filling it up to a predetermined middle depth with an insulating film formed by a coating method and sequentially stacking an insulating film formed by a chemical vapor deposition method thereon.

The present invention includes the steps of forming dummy patterns in one isolation region with a relatively large planer area of isolation regions with relatively different planar areas on a semiconductor substrate and filling an isolation trench formed on each of the isolation regions with relatively different planar areas on a semiconductor substrate by filling it up to a predetermined middle depth with an insulating film formed by a coating method and sequentially stacking an insulating film formed by a chemical vapor deposition method thereon.

The present invention includes the steps of forming a plurality of patterns, which are adjacent to each other, on a semiconductor substrate; filling a trench formed between the plurality of patterns, which are adjacent to each other, up to a predetermined middle position in its depth direction with a first insulating film deposited by a coating method; and filling a remaining depth portion of the trench into which the first insulating film is filled with a second insulating film.

In the manufacturing method, the plurality of patterns include a MISFET gate electrode and a dummy gate electrode, or an element isolation trench and a dummy pattern.

DESCRIPTION OF PREFERRED EMBODIMENTS

Figure 1:
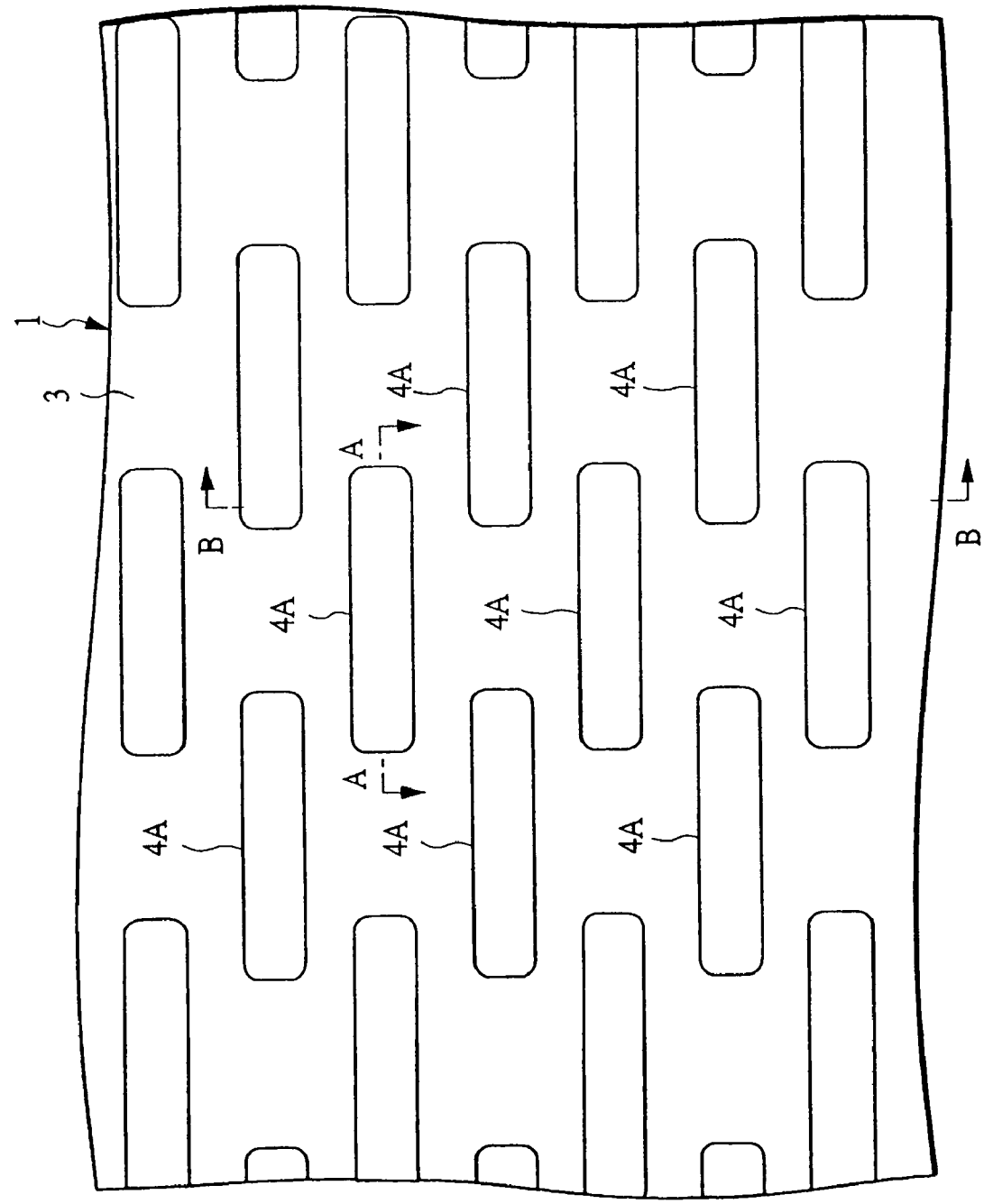
FIG. 1 is a top view of one embodiment of a semiconductor integrated circuit device during production according to the present invention.

Embodiments of the present invention will be described in detail with reference to the drawings. In all of the drawings used in the description of the embodiments, identical reference numerals will be given to those elements having identical functions, and repetitive descriptions will be omitted. Also, in the embodiments described herein, PMIS stands for a p-channel type metal insulator semiconductor field effect transistor (MISFET) while nMIS stands for an n-channel type MISFET.

First Embodiment

As a first embodiment, a description will be given of a case where the present invention is applied to a method of manufacturing a 1 giga(G) bit dynamic random access memory (DRAM), for example. It should be understood that it is not intended that the present invention be limited to application to a 1 Gbit DRAM, and it should be clear that the invention may be applied to other various semiconductor integrated circuit devices, such as an ASIC (Application Specific IC) including a 256 Mbit DRAM, a logic circuit with a DRAM or a complementary MOS (CMOS) circuit.

First of all a method for forming an isolation portion of the DRAM will be described with reference to FIGS. 1 to 19. FIG. 1 shows a top view of a memory cell array during a process for manufacturing a DRAM; FIGS. 2, 4, 6, 8, 10, 12, 14, 16, and 18 show sectional views of FIG. 1 taken on line A—A; and FIGS. 3, 5, 7, 9, 11, 13, 15, 17 and 19 show sectional views of FIG. 1 taken on line B—B.

Figure 2:
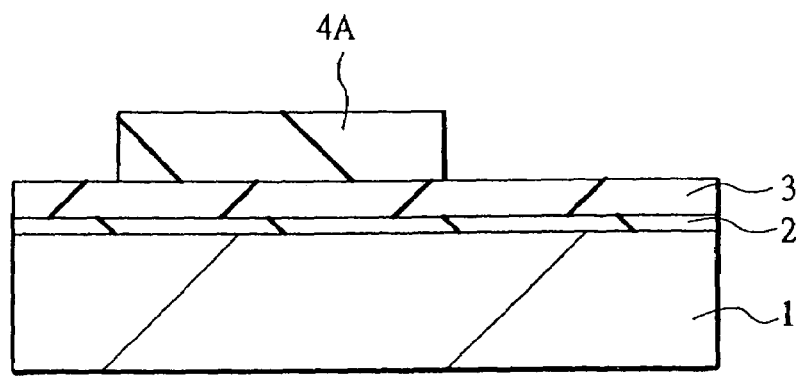
FIG. 2 is a sectional view of the semiconductor integrated circuit device taken on line A—A in FIG. 1.
Figure 3:
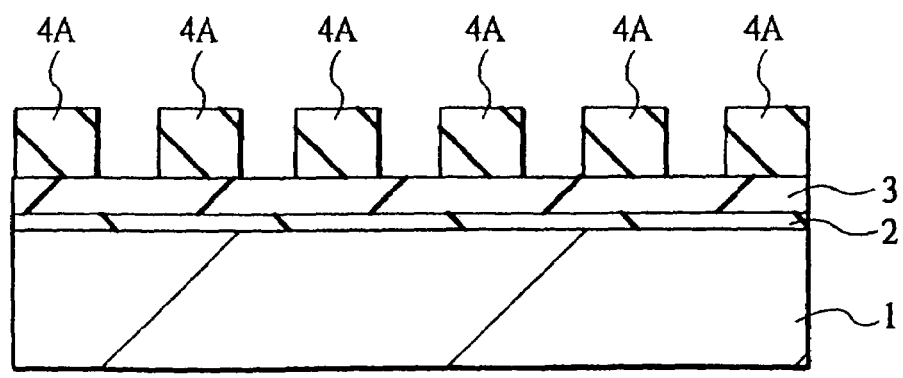
FIG. 3 is a sectional view of the semiconductor integrated circuit device taken on line B—B in FIG. 1.
Figure 4:
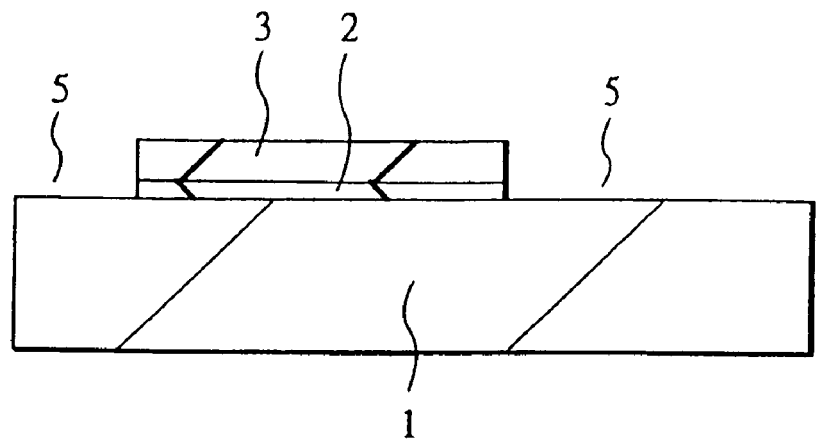
FIG. 4 is a sectional view of the semiconductor integrated circuit device, during a production step subsequent to that of FIGS. 2 and 3, taken on line A—A in FIG. 1.
Figure 5:
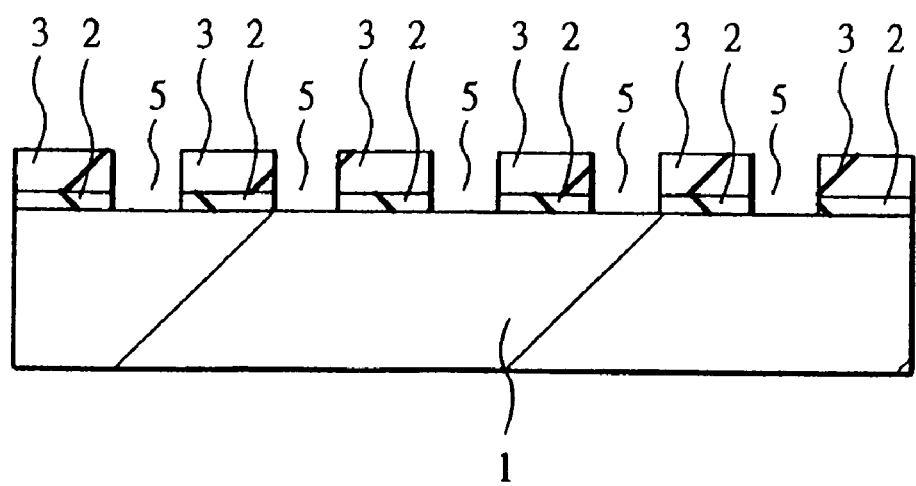
FIG. 5 is a sectional view of the semiconductor integrated circuit device, during a production step subsequent to that of FIGS. 2 and 3, taken on line B—B in FIG. 1.

As shown in FIGS. 1 to 3, an insulating film 2 made of silicon oxide ($SiO_2$), for example, is formed by a thermal oxidization method, for example, on a surface of a semiconductor substrate 1 (semiconductor wafer made of a thin plate having a planar, substantially circular shape at this point) made of p-type single crystal silicon with about 10 Ocm resistance. This insulating film 2 has the ability to relax stress during the thermal processing. Then, an insulating film 3 made of silicon nitride ($Si_3N_4$), for example, is formed by a chemical vapor deposition (CVD) method, for example, on the insulating film 2. Then, using the photolithography technique, a photo-resist film 4A is formed thereon, such that an isolation portion formed region with trench filled structure is exposed and an active region is covered. Subsequently, the photo-resist film 4A is used as in etching mask to etch and remove the insulating films 2 and 3, which are exposed from the photo-resist film 4A, by the dry-etching method, for example. Then, the photo-resist film 4A is removed. Thus, as shown in FIGS. 4 and 5, a trench opening 5 is formed where the isolation portion formed region is exposed and the active region is covered.

Figure 6:
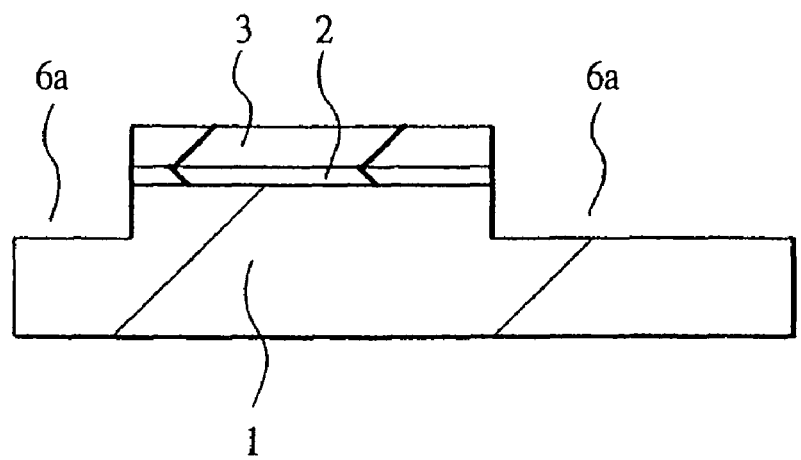
FIG. 6 is a sectional view of the semiconductor integrated circuit device, during a production step subsequent to that of FIGS. 4 and 5, taken on line A—A in FIG. 1.
Figure 7:
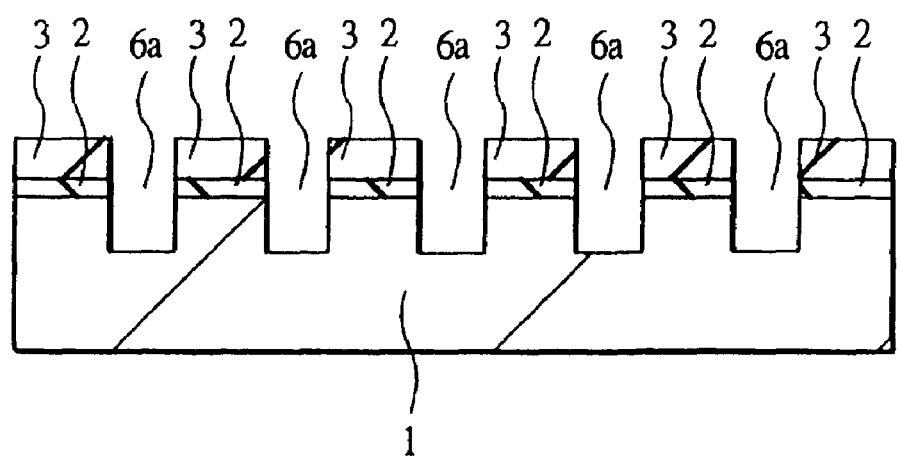
FIG. 7 is a sectional view of the semiconductor integrated circuit device, during a production step subsequent to that of FIGS. 4 and 5 taken on line B—B in FIG. 1.
Figure 8:
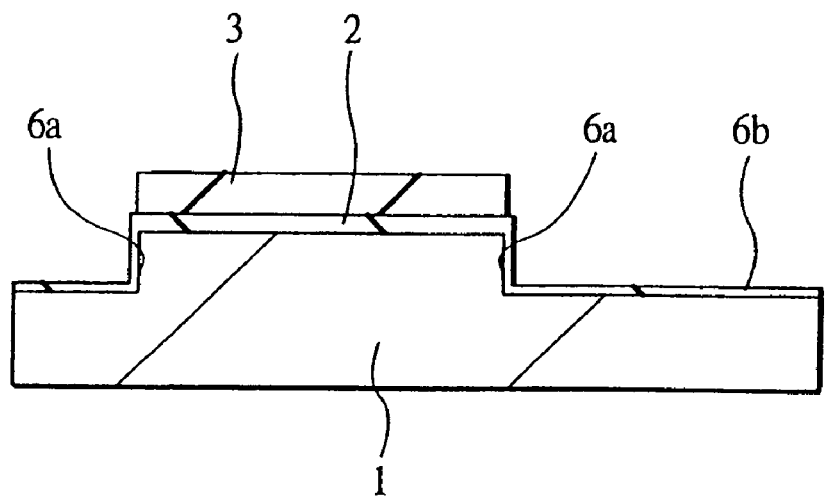
FIG. 8 is a sectional view of the semiconductor integrated circuit device, during a production step subsequent to that of FIGS. 6 and 7 taken on line A—A in FIG. 1.
Figure 9:
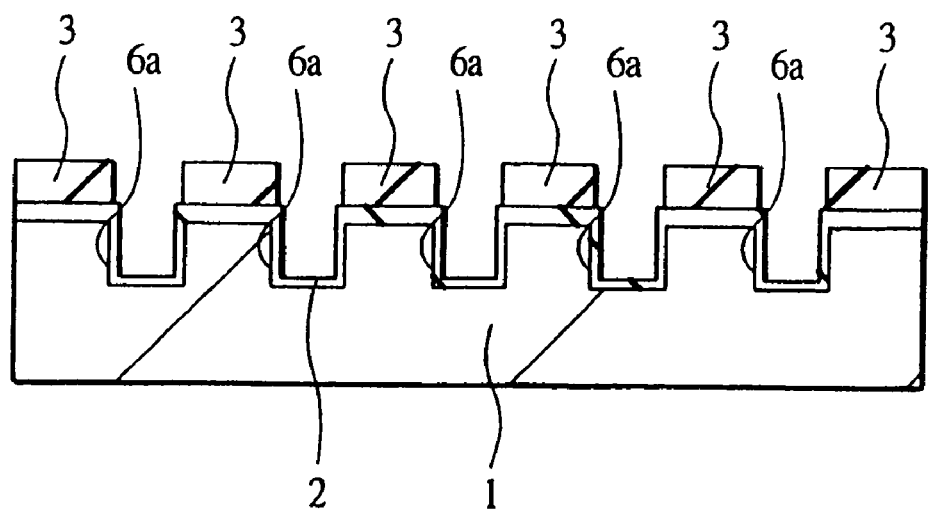
FIG. 9 is a sectional view of the semiconductor integrated circuit device, during a production step subsequent to that of FIGS. 6 and 7 taken on line B—B in FIG.
Figure 10:
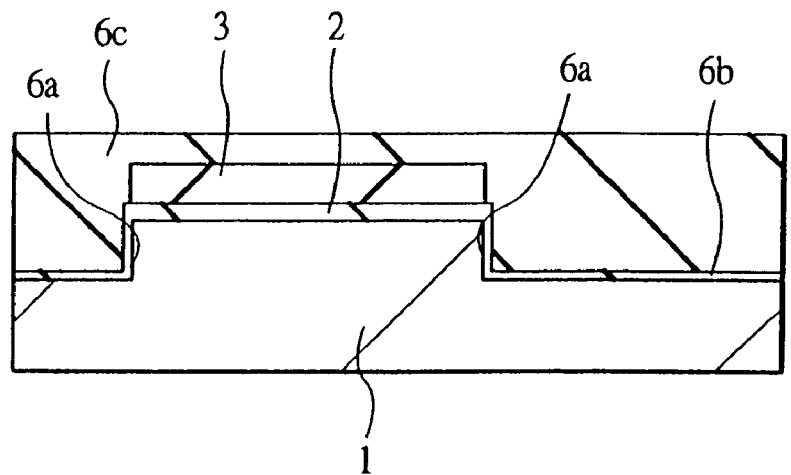
FIG. 10 is a sectional view of the semiconductor integrated circuit device, during a production step subsequent to that of FIGS. 8 and 9 taken on line A—A in FIG. 1.
Figure 11:
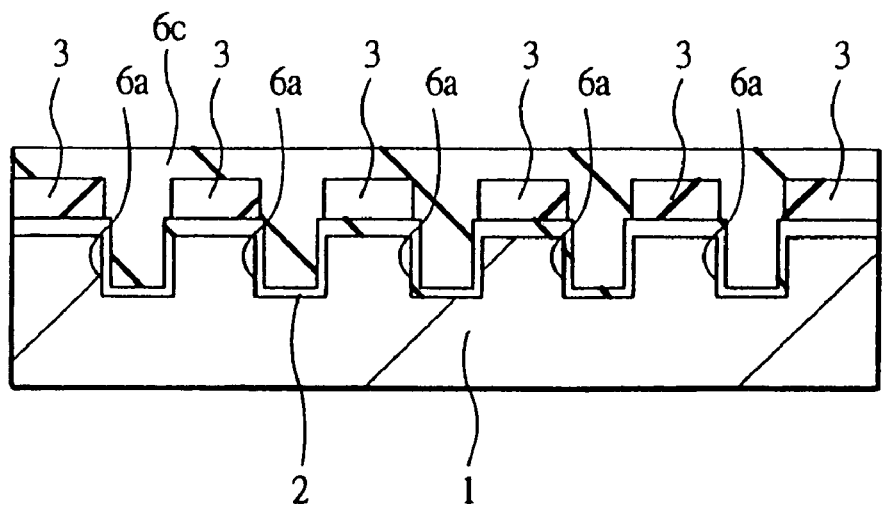
FIG. 11 is a sectional view of the semiconductor integrated circuit device, during a production step subsequent to that of FIGS. 8 and 9 taken on line B—B in FIG. 1.

Next, the insulating film 3 left on the semiconductor substrate 1 is used as a etching mask to etch and remove the semiconductor substrate 1, which is exposed from the trench opening 5, by the dry-etching method, for example. Thus, as shown in FIGS. 6 and 7, an isolation trench 6a is formed on the semiconductor substrate 1. The depth of the isolation trench 6a is about 350 nm, for example. Then, by performing thermal oxidation processing, for example, on the semiconductor substrate 1, as shown in FIGS. 8 and 9, an insulating film 6b made of silicon oxide ($SiO_2$), for example, is formed on a surface of the semiconductor substrate 1 within the isolation trench 6a. After that, as shown in FIGS. 10 and 11, the isolation trench 6a is filled on the main surface of the semiconductor substrate 1 by depositing a coating film (a first insulating film) 6c, such as an inorganic spin-on glass (SOG) film of polysilazane, for example, by th 6 rotary coating method, for example, so as to cover the insulating film 3. The coating film 6c is made of silicon oxide, for example, and has a higher flat property for filling a recessed portion formed by a substrate shape. Further, it is fluid with not more than 100 mPa□s viscosity coefficient at a temperature of about 25 □C, for example. Accordingly, the coating film 6c has a higher reflow property and an excellent gap-fill property on a fine space. Thus, no void is caused even when it is filled in the isolation trench 6a, which is fine to almost the resolution limit of photolithography. Further, at this point, the top surface of the coating film 6c is substantially flat over the entire surface on the main surface of the semiconductor substrate 1.

Figure 12:
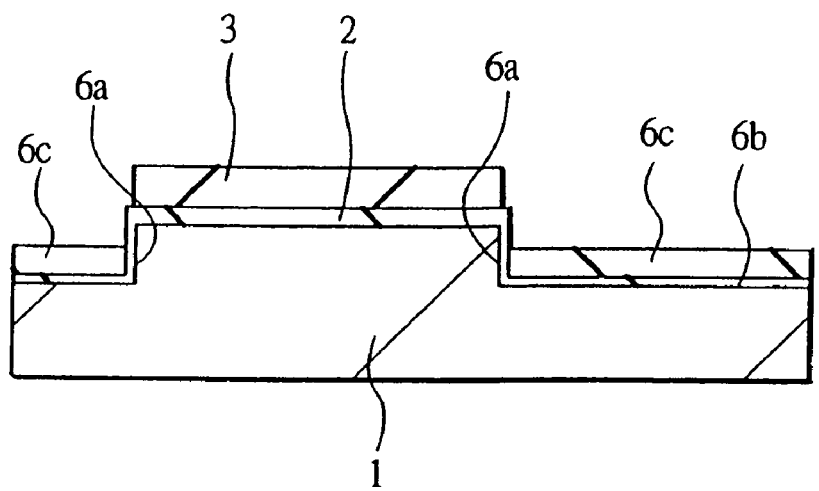
FIG. 12 is a sectional view of the semiconductor integrated circuit device, during a production step subsequent to that of FIGS. 10 and 11 taken on line A—A in FIG. 1.
Figure 13:
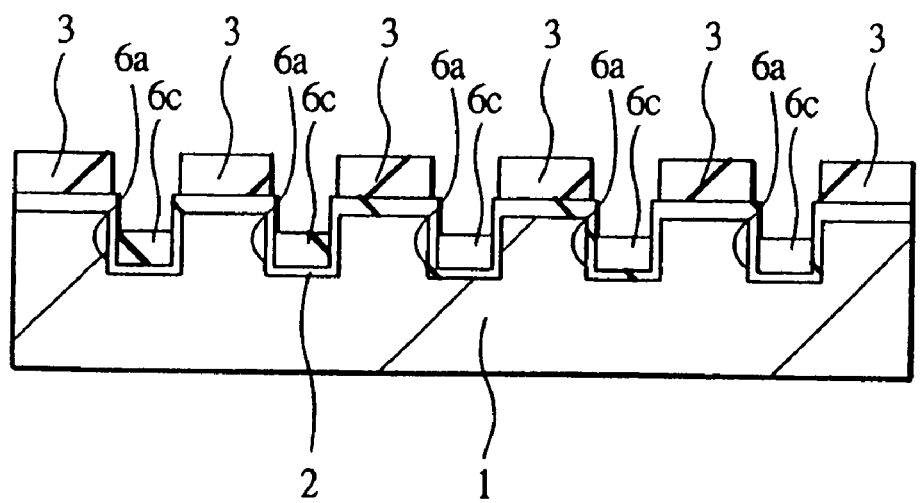
FIG. 13 is a sectional view of the semiconductor integrated circuit device, during a production step subsequent to that of FIGS. 10 and 11 taken on line B—B in FIG. 1.
Figure 14:
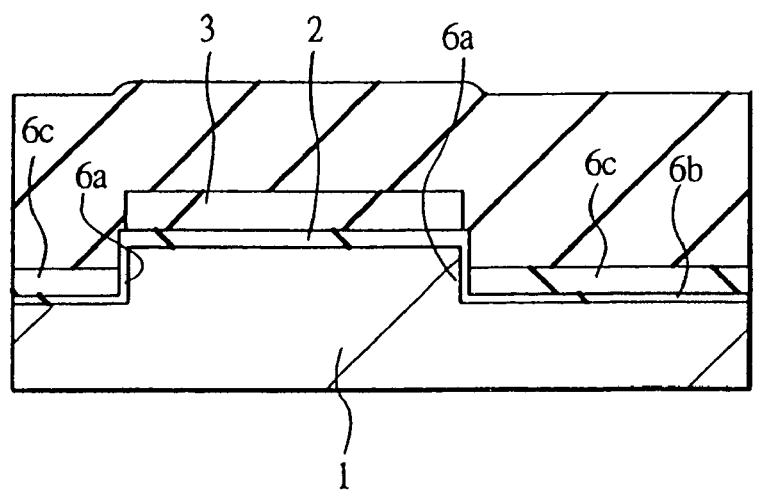
FIG. 14 is a sectional view of the semiconductor integrated circuit device, during a production step subsequent to that of FIGS. 12 and 13 taken on line A—A in FIG. 1.
Figure 15:
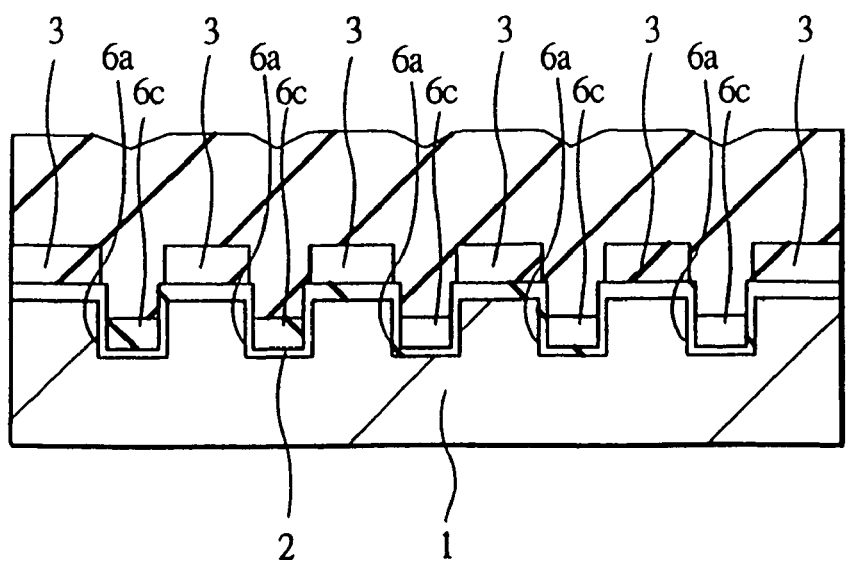
FIG. 15 is a sectional view of the semiconductor integrated circuit device, during a production step subsequent to that of FIGS. 12 and 13 taken on line B—B in FIG. 1.

Next, as shown in FIGS. 12 and 13, the insulating film 3 is used as an etching mask to etch and remove the coating film 6c leaving a portion thereof up to predetermined middle position in a depth direction of the isolation trench 6a. As a result, the isolation trench 6a gets shallower. Here, a portion of the coating film 6c is left in the isolation trench 6a so that the aspect ratio of the isolation trench 5a is not more than 3, for example. Then, thermal processing at 800 □C is performed on the semiconductor substrate 1 for about one minute in a nitrogen gas atmosphere, for example. As a result, the film quality of the coating film 6c can be improved, which reduces its wet-etching rate. After that, as shown in FIGS. 14 and 15, an insulating film (a second insulating film) 6d made of a silicon oxide film, for example, is deposited on the main surface of the semiconductor substrate 1 by the CVD method, for example, using a mixture gas of tetraethoxysilane (TEOS) and ozone ($O_3$), or a mixture gas of monosilane and oxygen, for example, in order to fill the remaining depth portion of the isolation trench 6a. Here, since the aspect ratio of the isolation trench 6a (remaining depth portion) is not more than 3, the isolation trench 5a can be filled in such a way that no holes, voids, or seams are formed in the insulating film 6d within the isolation trench 6a. Further, the deeper the isolation trench 6a is, the more uneven the main surface of the semiconductor substrate 1 is. Thus, the deposition thickness of the insulating film 6d for filling the isolation trench 6a must be thicker to some extent in order to prevent unevenness on the top surface of the insulating film 6d. However, in this first embodiment, the depth of the isolation trench 6a is reduced by using a coating film 6c in advance so that the unevenness on the main surface of the semiconductor substrate 1 can be reduced. As a result the deposition thickness of the insulating film 6d can be thinner. The insulating film 6d is finer than the coating film 6c. Therefore, even when it is exposed to light from a part of a contact hole described later during formation of the contact hole, it is difficult to be etched and removed.

Figure 16:
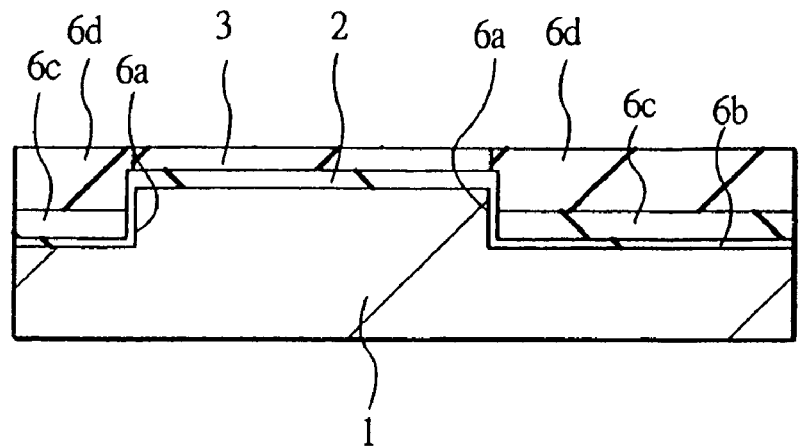
FIG. 16 is a sectional view of the semiconductor integrated circuit device, during a production step subsequent to that of FIGS. 14 and 15 taken on line A—A in FIG. 1.
Figure 17:
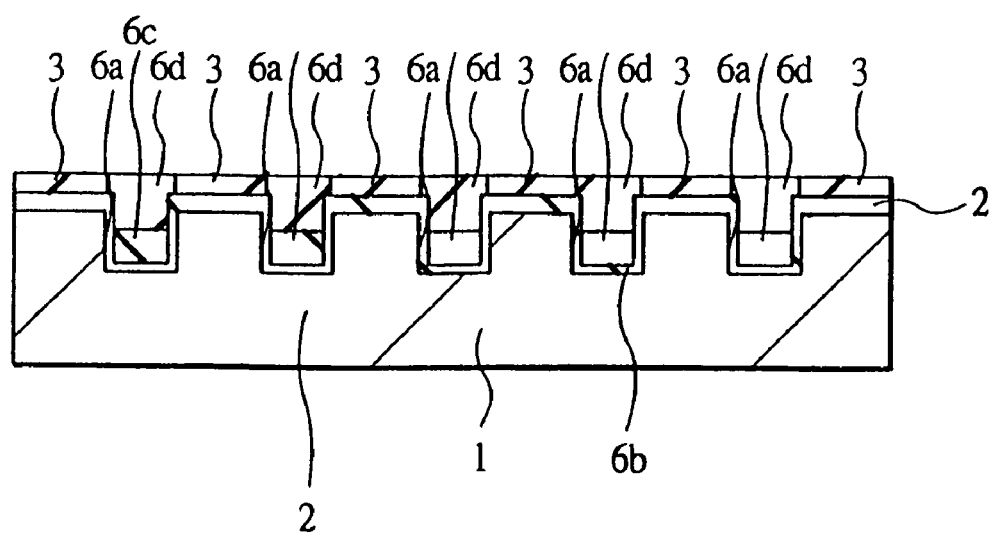
FIG. 17 is a sectional view of the semiconductor integrated circuit device, during a production step subsequent to that of FIGS. 14 and 15 taken on line B—B in FIG. 1.
Figure 18:
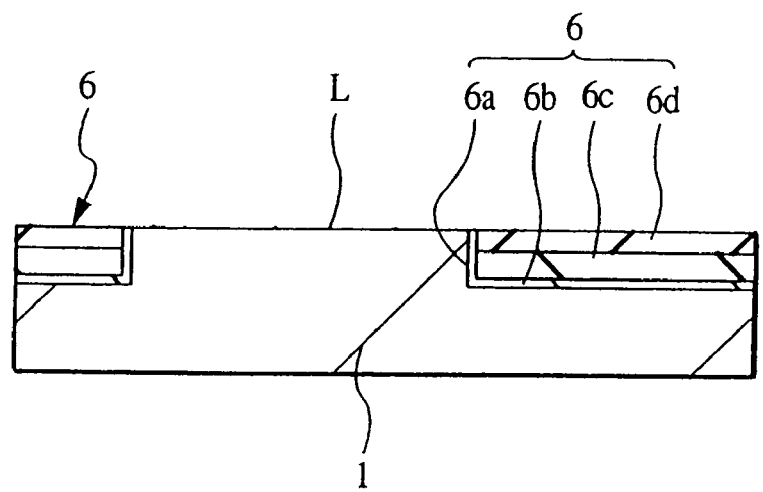
FIG. 18 is a sectional view of the semiconductor integrated circuit device, during a production step subsequent to that of FIGS. 16 and 17 taken on line A—A in FIG. 1.
Figure 19:
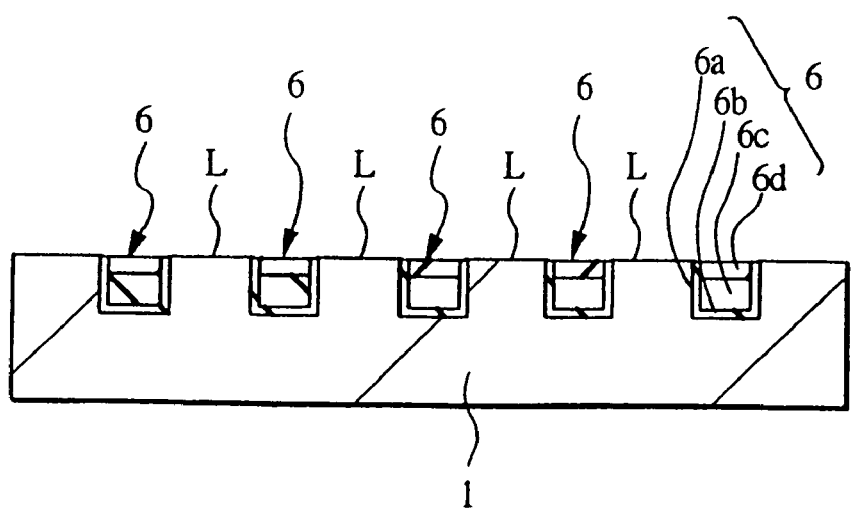
FIG. 19 is a sectional view of the semiconductor integrated circuit device, during a production step subsequent to that of FIGS. 16 and 17 taken on line B—B in FIG. 1.

Next, as shown in FIGS. 16 and 17, the insulating film 3 is used as an etching-stopper to polish the insulating film 6d by the chemical mechanical polishing (CMP) method. Here, according to the first embodiment, since the deposition thickness of the insulating film 6d can be thinner, the amount of polishing of the insulating film 6d by CMP can be reduced. Thus, the polishing variation of CMP can be reduced. Then, etching processing is performed on the semiconductor substrate 1 in order to etch and remove the insulating films 2 and 3. As a result, as shown in FIGS. 18 and 19, an isolation portion 6 with a trench filled structure is formed. By forming the isolation portion 6, an active region L which has a long and narrow island-shaped pattern surrounded by the isolation portion 6 is formed at the same time in a region Where memory cells are formed (memory cell array). Also, in a region where peripheral circuits are formed, an active region, not shown, surrounded by the isolation portion 6 is formed at the same time. The top surface of the isolation portion 6, that is, the top surface of the insulating film 6d, is flattened so as to be at substantially the same level as the top surface of the active region L. No holes, voids or seams are formed on the top surface portion of the insulating film 6d.

Figure 20:
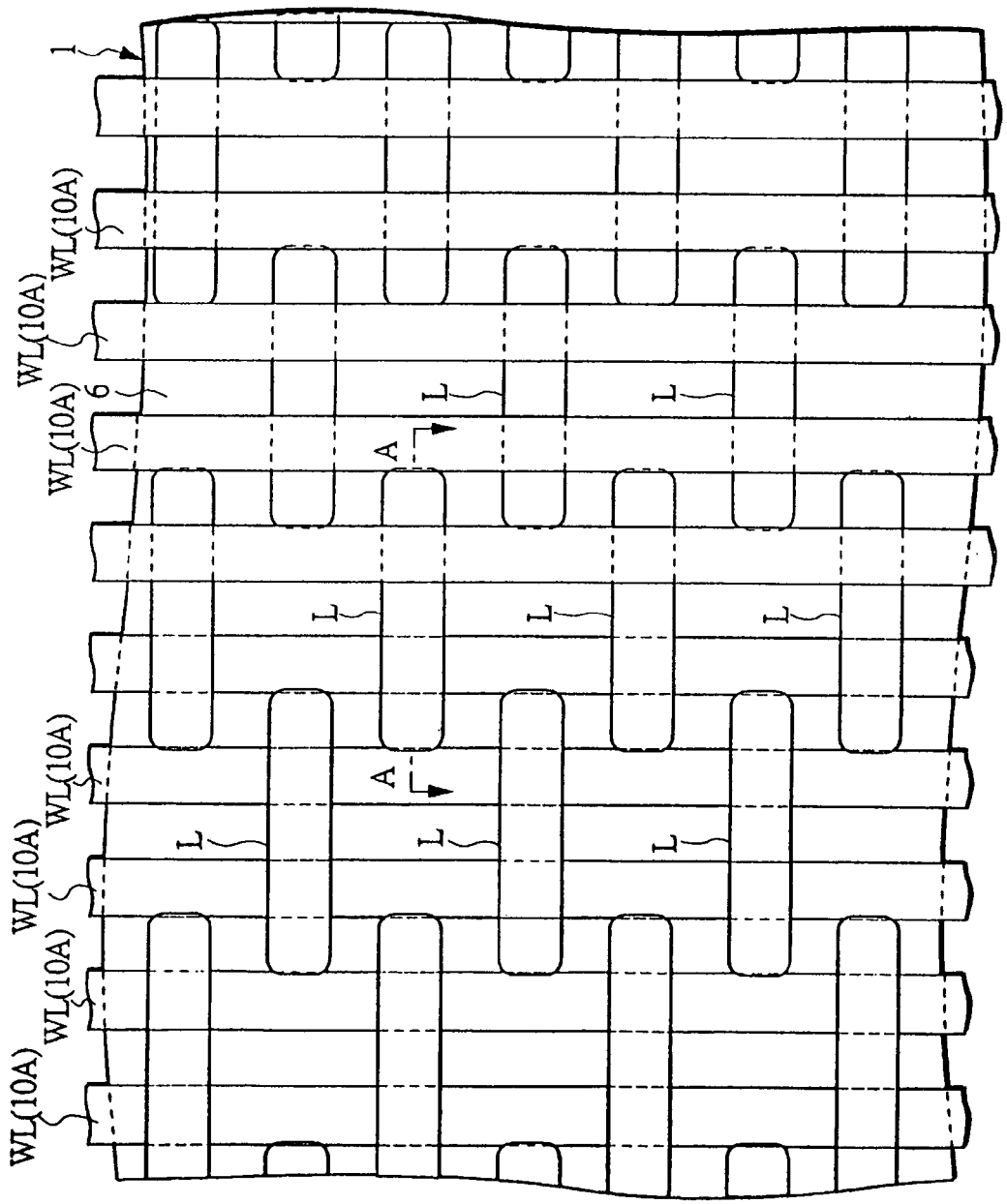
FIG. 20 is an essential portion top view of the semiconductor integrated circuit device, during a production step subsequent to that of FIGS. 18 and 19.

Next, with reference to FIGS. 20 to 26, an explanation will be given of a method of forming a gate electrode of the DRAM and an inter-layer insulating film covering it. FIG. 20 shows a top view of a memory cell array at the same planar position as in FIG. 1 during a process for manufacturing the DRAM; and FIGS. 21 to 26 show sectional views taken on line A—A in FIG. 20, respectively.

Figure 21:
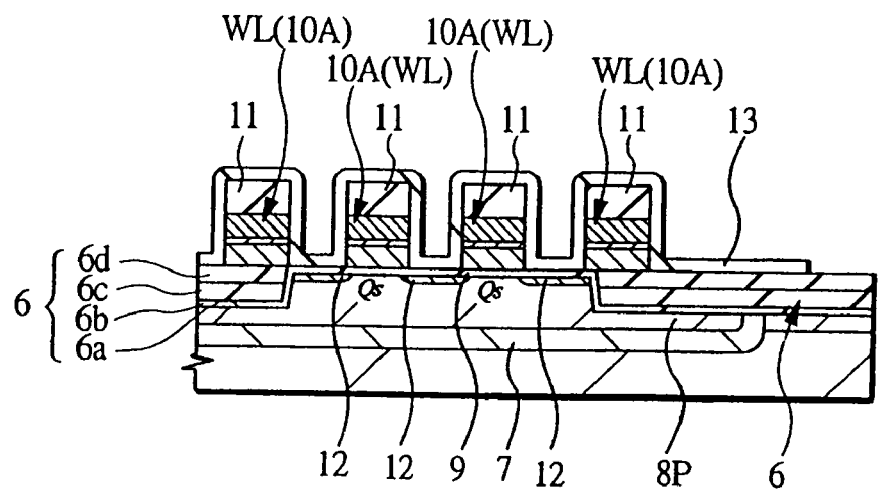
FIG. 21 is a sectional view of the semiconductor integrated circuit device, during a production step subsequent to that of FIGS. 18 and 19 taken on line A—A in FIG. 20.

First of all, as shown, in FIGS. 20 and 21, phosphorus (P), for example, is ion-implanted into the semiconductor substrate 1 of the memory cell array in order to form an n-type semiconductor region 7. Then, boron (B), for example, is ion-implanted into the memory cell array and a part of the peripheral circuit (a region where nMIS is formed) in order to form a p-type well 8P. Phosphorus (P), for example, is ion-implanted into another part of the peripheral circuit (a region where pMIS is formed) in order to form an n-type well. Then, impurities for adjusting the threshold voltage of the MISFET, such as boron fluoride ($BF_2$), are ion-implanted into the p-type well 8P and the n-type well. After cleaning surfaces of the p-type well 8P and the n-type well with a cleaning solution of hydrofluoric acid (HF), the semiconductor substrate 1 is wet oxidized in order to form a clean gate insulating film 9 made of silicon oxide, for example, on the surfaces of the p-type well 8P and the n-type well. After that, gate electrodes 10A (word lines WL) are formed on a top surface of the gate insulating film 9. Each of the gate electrodes 10A is formed by depositing a polycrystal silicon film, to which impurities such as P (Phosphorus) are doped, on the semiconductor substrate 1 by the CVD method, depositing a tangstenniteride (WN) film and a tungsten (W) film thereon in order from a bottom layer by a sputtering method, depositing an insulating film 11 made of silicon nitride ($Si_3N_4$), for example, there on by the CVD method, and then patterning these films by using a photo-resist film as a mask. The tangstenniteride film for forming the gate electrode 10A functions as a barrier layer for preventing a highly resistant silicide layer from being formed on the interface of the tungsten film and the polycrystal silicon film when they are reacted during the thermal processing at a higher temperature. The barrier layer may be a higher melting point metal nitride film, such as a titaniteride (TiN) film, as an alternative to the tangsteniteride film. The electric resistance of the gate electrode 10A (word line WL) with a polymetal structure including the higher melting point metal film and the polycrystal silicon film mainly is lower than that of a gate electrode including a poly crystal silicon film or a polycide film (a stacking film of a high melting point metal silicide film and a polycrystal silicon film). Therefore, signal delays of the word line WL can be reduced. In the first embodiment, no holes or voids are formed on the top surface of the isolation portion 6. Thus, it is possible to prevent short circuit failures between adjacent word lines WL due to material of the word lines WL left in the holes or voids on the top surface of the isolation portion 6 during word line WL patterning.

Next, P (phosphorus) is ion-implanted into the p-type well 8P to form a pair of n⁻ type semiconductor regions 12 for being use as a source and a drain on the p-type well 8P on both sides of the gate electrode 10A. Processes up to this point can substantially complete MISFETQs for memory cell selection. After an insulating film 13 made of silicon nitride ($Si_3N_4$), for example, is deposited on the main surface of the semiconductor substrate 1 by the CVD method, the insulating film 13 of the memory cell array is covered with a photo-resist film, not shown, to anisotropy-etch the insulating film 13 in the peripheral circuit region. Thus, in the memory cell array, the insulating film 13 is formed so as to cover the surface of the gate electrode 10A and the surface of the semiconductor substrate 1. Also, in the peripheral circuit region, a sidewall spacer is formed on a sidewall of a gate electrode of a MISFET forming the peripheral circuit. This etching is performed by using gas for etching the insulating film 13 made of silicon nitride, for example, with a higher selecting ratio in order to minimize the amount of grating of the insulating film 6d filled in the isolation portion 6.

By the way, the word line WL (that is, gate electrode) has a polymetal structure as described above. Accordingly, it is longer in size in a height direction than a word line with a structure formed by a polycrystal silicon film only. In addition, the dimension between adjacent word lines is smaller in order to increase the capacity of the memory. Accordingly, the aspect ratio of a trench formed between adjacent word lines gets larger. In the first embodiment, for example, the width and depth of the trench formed between adjacent word lines WL (gate electrodes 10A) are about 70 nm and about 300 nm, for example, respectively. Accordingly, the aspect ratio of the trench is 4 or above, for example.

Figure 22:
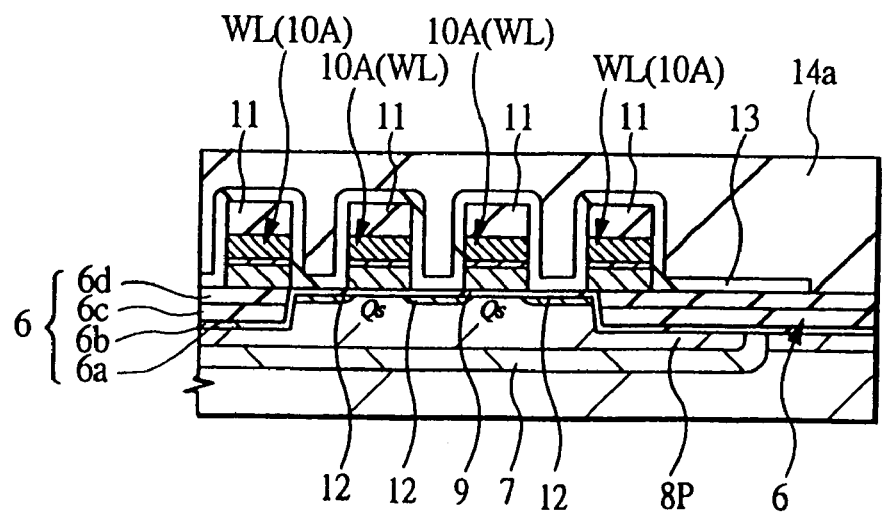
FIG. 22 is a sectional view of the semiconductor integrated circuit device, during a production step subsequent to that of FIG. 21 taken on line A—A in FIG. 20.

Thus, in the first embodiment, processing is performed as follows:

First of all, as shown in FIG. 22, a coating film (first insulating film) 14a, such as an inorganic SOG film of silicon oxide, for example, is deposited on the main surface of the semiconductor substrate 1 by the rotary coating method in order to fill a trench formed between adjacent word lines WL (that is, gate electrodes 10A). The coating film 14a is identical to the coating film 6c and has a substantially flat top surface. The coating film 14a has a higher reflow property than a glass-flow film such as a BPSG film, and is excellent in gap-fillability for finer spaces. Therefore, no voids are created even when it is filled between adjacent gate electrodes 10A (word lines WL) which is fine almost up to the resolution limit of photolithography. Further, the coating film 14a can obtain a higher reflow property without thermal processing at a high temperature for a long period, as required for the BPSG film, for example. Therefore, thermal diffusion of impurities implanted into the source and the drain of the MISFETQs for memory cell selection and the source and the drain of the MISFET (nMIS, PMIS) of the peripheral circuit can be suppressed in order to attain a shallow junction of the coating film 14a. Also, oxidation of the metal (tungsten film) forming the gate electrode 10A (word line WL) during thermal processing can be suppressed. Therefore, the performance of the MISFETQs for memory cell selection and the MISFET of the peripheral circuit can be higher.

Figure 23:
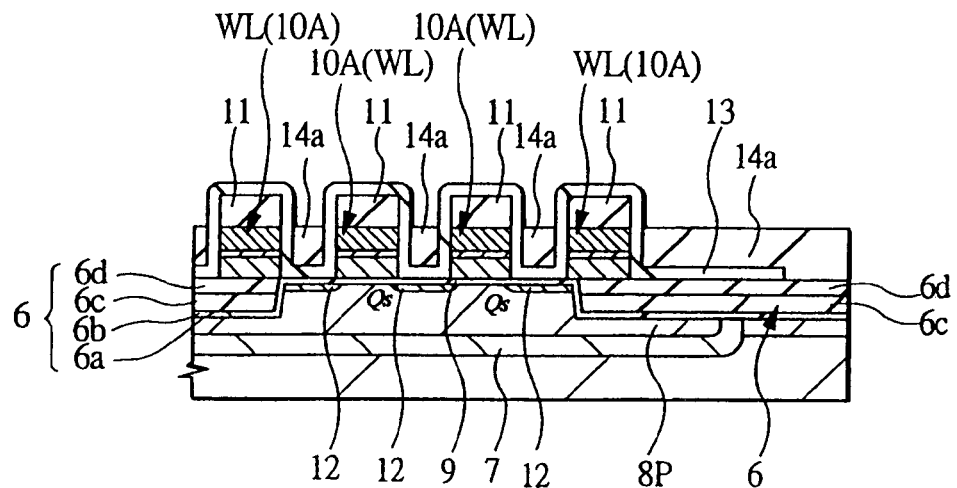
FIG. 23 is a sectional view of the semiconductor integrated circuit device, during a production step subsequent to that of FIG. 22 taken on line A—A in FIG. 20.
Figure 24:
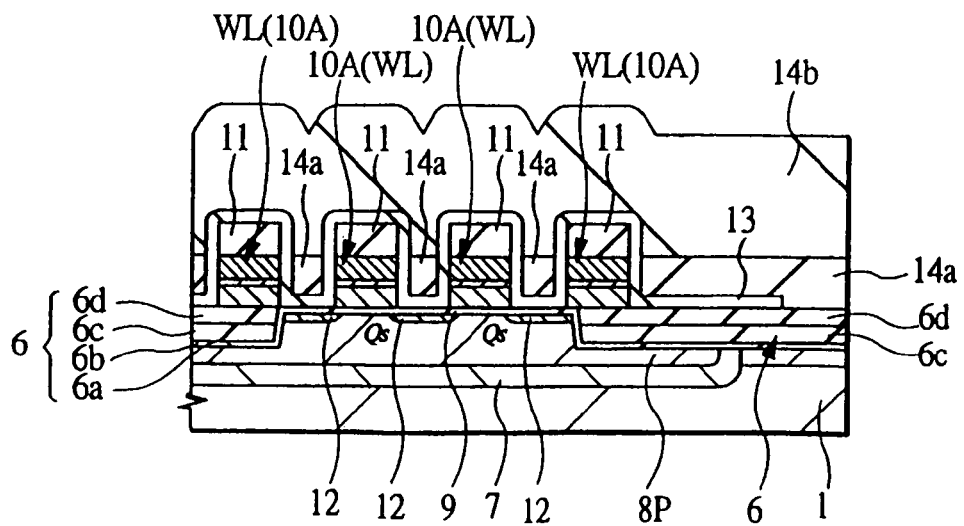
FIG. 24 is a sectional view of the semiconductor integrated circuit device, during a production step subsequent to that of FIG. 23 taken on line A—A in FIG. 20.

Next, as shown in FIG. 23, the insulating film 13 is used as an etching mask in order to etch and remove the coating film 14a leaving a portion thereof up to a predetermined middle position in a depth direction of the trench between adjacent word lines WL. As a result, the trench between adjacent word lines WL gets shallower. Here again, a portion of the coating film 14a is left in the trench so that an aspect ratio of the trench is not more than 3, for examples Then, thermal processing at 800□C is performed on the semiconductor substrate 1 for about one minute in a nitrogen gas atmosphere, for example, in order to make the coating film 14a finer. As a result, the film quality of the coating film 14a can be improved, which reduces its wet-etching rate. After that, as shown in FIG. 24, an insulating film (a second insulating film) 14b made of a silicon oxide film, for example, is deposited on the main surface of the semiconductor substrate 1 by the CVD method, for example, using a mixture gas of tetraethoxysilane (TEOS) and ozone ($O_3$), or a mixture gas of monosilane and oxygen, for example, in order to fill the remaining depth portion of the trench between adjacent word lines WL. Here, since the aspect ratio of the trench between adjacent word lines WL (remaining depth portion) is not more than 3, the trench can be filled where no holes, voids, or seams are formed in the insulating film 14b within the trench. Further, the deeper the trench is, the more uneven the main surface of the semiconductor substrate 1 is. Thus, the deposition thickness of the insulating film 14b for filling the trench must be thicker to some extent in order to prevent unevenness on the top surface of the insulating film 14b. However, in this first embodiment, the depth of the trench between adjacent word lines WL is shallower due to use of the coating film 14a in advance so that the unevenness on the main surface of the semiconductor substrate 1 can be reduced. As a result, the deposition thickness of the insulating film 14b can be thinner. The insulating film 14b is finer than the coating film 14a in the same manner as the insulating film 6d.

Figure 25:
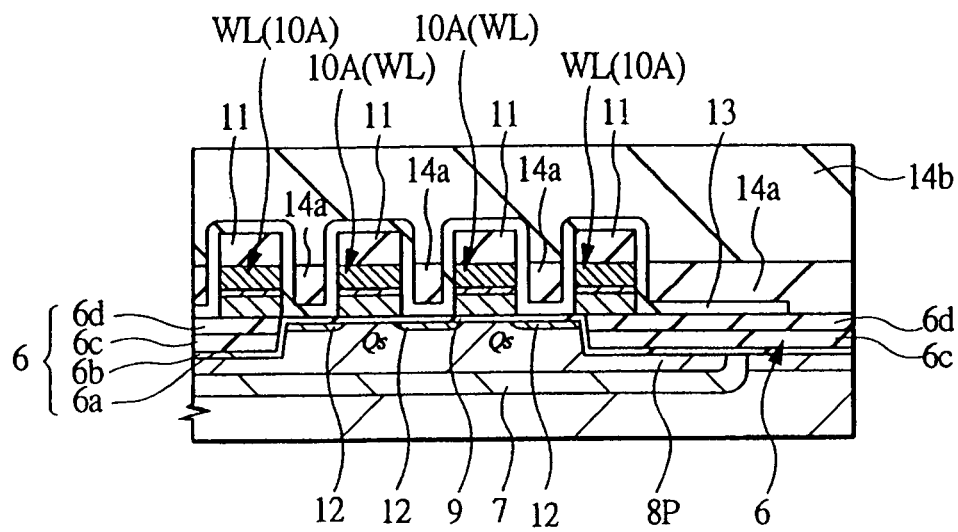
FIG. 25 is a sectional view of the semiconductor integrated circuit device, during a production step subsequent to that of FIG. 24 taken on line A—A in FIG. 20.
Figure 26:
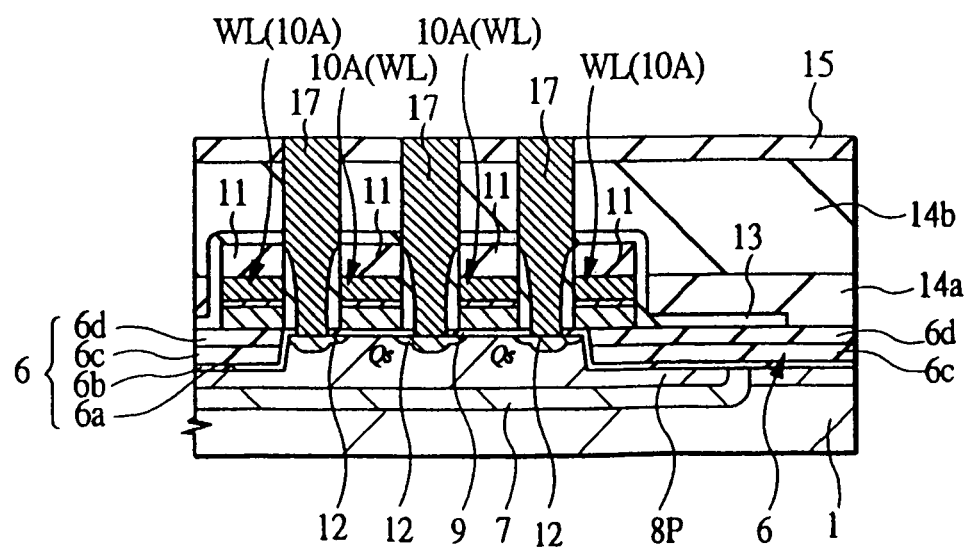
FIG. 26 is a sectional view of the semiconductor integrated circuit device, during a production step subsequent to that of FIG. 25 taken on line A—A in FIG. 20.

Next, as shown in FIG. 25, the top surface of the insulating film 14b is polished by the CMP method, for example, in order to flatten the top surface. Then, as shown in FIG. 26, an insulating film 15 made of silicon oxide ($SiO_2$), for example, is deposited on the insulating film 14b by the CVD method, for example. The upper insulating film 15 is deposited in order to repair fine flaws on the surface of the lower insulating film 14b occurred when it is polished by the CMP method. Then, the insulating films 15 and 14b and the coating film 14a above a n⁻ type semiconductor region (source, drain) 12 of the MISFETQs for memory cell selection are sequentially removed by dry etching with the photo-resist film being used as a mask. The etching is performed under the condition that the etching selecting ratio between silicon oxide and silicon nitride is increased so that silicon oxide is easier to be etched than silicon nitride. Thus, it is possible to prevent the silicon nitride film 13 below the coating film 14a from being removed. Then, the silicon nitride film 13 above the n⁻ type semiconductor region (source, drain) 12 is removed by dry etching with the photo-resist film used as a mask. Subsequently, the thin gate insulating film 9 therebelow is removed. Thus, a contact hole 16a is formed on one n⁻ type semiconductor region (source, drain) 12, and a contact hole 16b is formed on the other one. The contact hole 16a (contact hole on the n type semiconductor region 12 shared by two MISFETQs for memory cell selection) has a long narrow pattern such that its planar dimension in the word line WL extending direction is twice as long as the dimension in the word line WL traversing direction. That is, the contact hole 16a has a planar, substantially rectangular-shaped pattern such that the planar dimension in the word line WL extending direction is larger than the planar dimension in the word line WL width dimension, a part of which extends onto the isolation portion 6 away from the active region L. The etching is performed on the insulating film 13 made of silicon nitride, for example, under the condition that the etching selecting ratio between silicon oxide and silicon nitride is increased so that silicon nitride is easier to be etched and removed than silicon oxide in order to minimize the amount of grating of the semiconductor substrate 1 and the isolation portion 6. Further, the etching is performed under the condition where the insulating film 13 made of silicon nitride, for example, is anisotropy-etched so as to leave the insulating film 13 made of silicon nitride on the side wall of the g-ate electrode 10A (word line WL). Thus, the contact holes 16a and 16b, which are as fine as their diameter in the word line WL width direction is under the photolithography resolution limit, can be formed in self-aligned manner with respect to the gate electrode 10A (word line WL). After the contact holes 16a and 16b are formed, phosphorus, for example, may be ion-implanted to the p-type well 8P through the contact holes 16a and 16b so as to form the n-type semiconductor region 12A on the p-type well 8P in a region deeper than the source and drain of the MISFETQs for memory cell selection. The n-type semiconductor region 12A can alleviate an electric field concentrated at an end portion of the source and drain. Thus, leakage current at the end portion of the source and drain can be decreased to improve the refresh characteristic of the memory cells.

Figure 27:
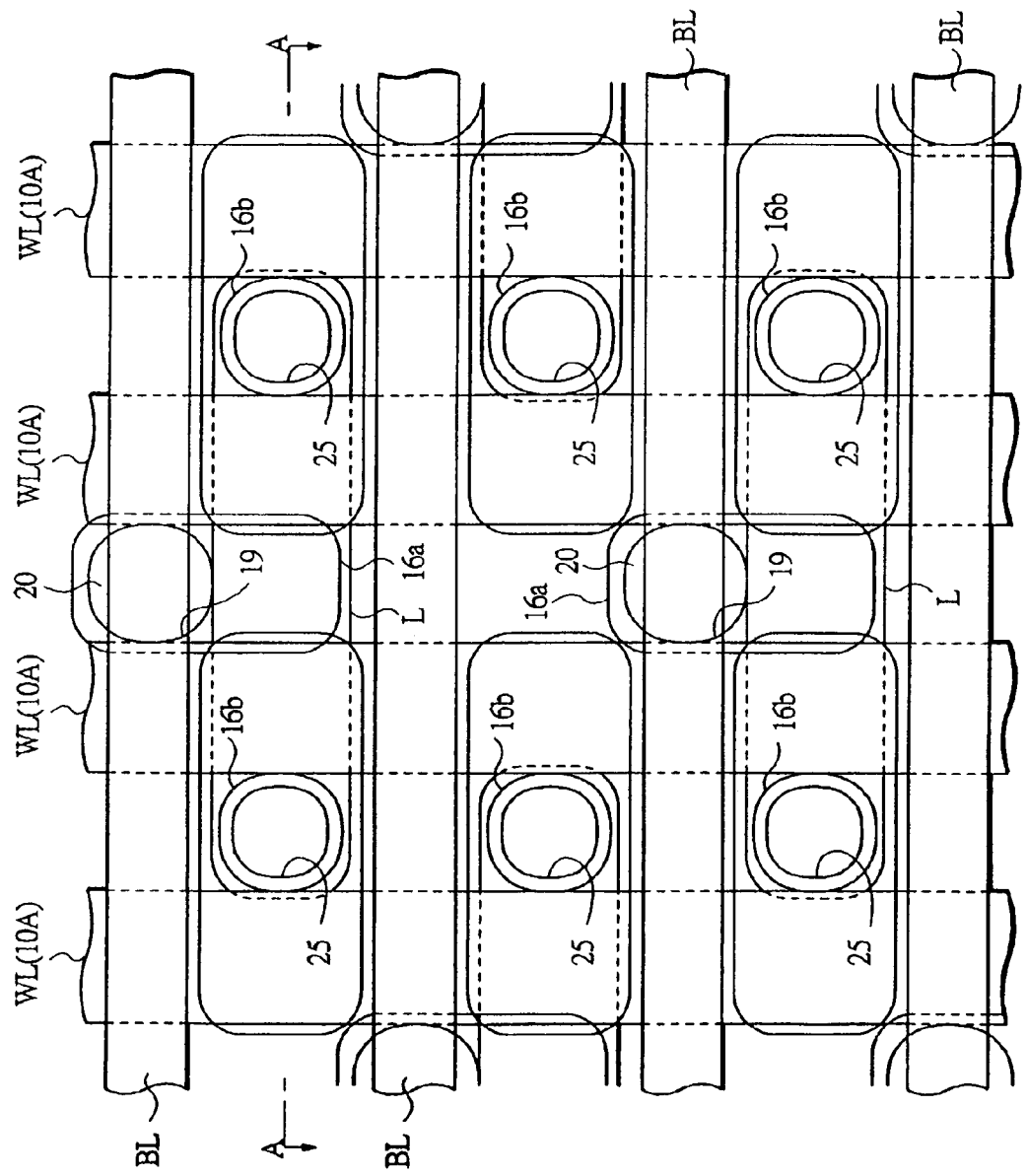
FIG. 27 is a top view of the semiconductor integrated circuit device during a production step subsequent to FIG. 26.
Figure 28:
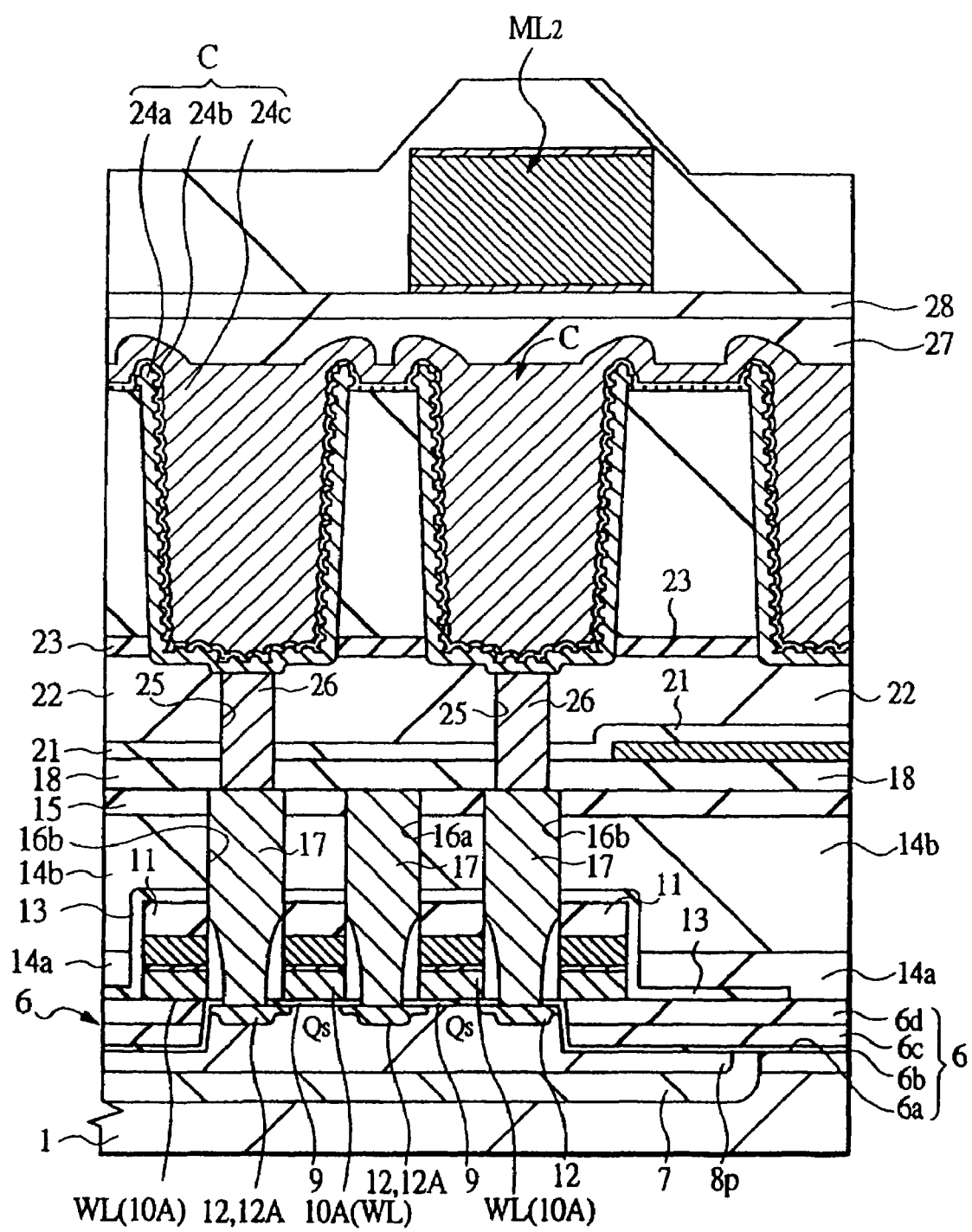
FIG. 28 is a sectional view taken on line A—A in FIG. 27.

Next, a plug 17 is formed within the contact holes 16a and 16b. The plug 17 is formed by depositing a polycrystal silicon film to which arsenic (As), for example, is doped, on the semiconductor substrate 1 by the CVD method, for example, polishing the polycrystal silicon film by the CMP method, and then leaving it within the contact holes 16a, 16b. Subsequently, a semiconductor integrated circuit device is manufactured in accordance with a general method of manufacturing a DRAM. A top view and one example of sectional views taken on line A—A of a memory cell array of the DRAM are shown in FIGS. 27 and 28, respectively.

An insulating film 18 made of silicon oxide, for example, is formed on the insulating film 15. A through-hole 19 is formed on the insulating film 18 above the contact hole 16a located flat on the isolation portion 6 away from the active region L. Within the through-hole 19, a plug 20 is filled which is made of electrically conductive films where a Ti (titan) film, a TiN (titan nitride) film and a W film are stacked from the bottom. Formed on an interface between the plug 20 and the plug 7 filled in the contact hole 16a under the through-hole 19 is a titanisilicide ($TiSi_2$) layer generated by a reaction between the Ti film forming a part of the plug 20 and the poly-crystal-silicon film forming the plug 7. A bit line BL is formed on the insulating film 18. The bit line BL is arranged above the isolation portion 6 (a region sandwiched by active regions L) two-dimensionally and extends with a uniform width and a uniform space linearly along the word line WL width direction. The bit line BL is made of high melting point metal, such as tungsten, and is connected electrically with one of the source and drain of the MISFETQs for memory cell selection (the n⁻ type semiconductor region 12, n type semiconductor region 12A shared by two MISFETQs for memory cell selection) through the through hole 19 formed in the insulating film 18 and the contact hole 16 formed in the insulating films therebelow (insulating film 15 and 14b, coating film 14a and gate insulating film 9). Forming the bit line BL with metal (such as tungsten) allows the reduction of its resistance, which further allows rapid reading and writing of information. Further, since the bit line BL and a first layer wire of a peripheral circuit below can be formed simultaneously through the same process, the process for manufacturing the DRAM can be simplified. Forming the bit line. BL with metal (such as tangsten) with higher heat-resistance and electro-migration resistance can prevent disconnection with certainly even if the width of the bit line BL is finer.

Formed on the bit line BL and the first layer wire are insulating films 21 and 22 made of silicon oxide ($SiO_2$), for example. The upper insulating film 22 has a flat top surface. An insulating film 23 made of silicon nitride ($Si_3N_4$), for example, is formed on the insulating film 22 of the memory cell array. A cylindrical (crown), for example, information storage capacitor element C is formed thereon. The information storage capacitor element C has a bottom electrode (storage electrode) 24a, a top electrode (plate electrode) 24b, and a capacitor insulating film (dielectric film) 24c made of tantalum oxide ($Ta_2O_5$) arranged therebetween. The bottom electrode 24a is made of, for example, a low resistant polycrystal silicon film to which phosphorus (P) is doped, while the top electrode 24b is made of, for example, a TiN film. The bottom electrode 24a of the information storage capacitor element C is arranged in a long and narrow planar pattern extending straight along the word line width direction in FIG. 27. The bottom electrode 24a is electrically connected to the plug 17 within the contact hole 16b through a plug 26 filled within a through-hole 25, which passes through the insulating films 23, 22, 21, and 18. Further, it is electrically connected to the other one of the source and drain (n⁻ type semiconductor region 12, n type semiconductor region 12A) of the MISFETQs for memory cell selection through the plug 27. The plug 26 made of a low resistant polycrystal silicon film to which phosphorus (P) is doped, tungsten or titan nitride, for example, is filled within the through hole 25 formed between the bottom electrode 24a and the contact hole 16b. Two insulating films 27 and 28 made of silicon oxide ($SiO_2$), for example, are formed at the top of the information storage capacitor element C. Further, a second layer wire ML2 is formed thereon. The second layer wire ML2 is made of an electrically conductive film containing mainly aluminum (Al) alloy. An insulating film 29 made of silicon oxide ($SiO_2$), for example, is formed on the second layer wire ML2. The insulating film 29 is formed by the high density plasma CVD method, which has an excellent gap-fill property for the second layer wire ML 2.

Second Embodiment

Figure 35:
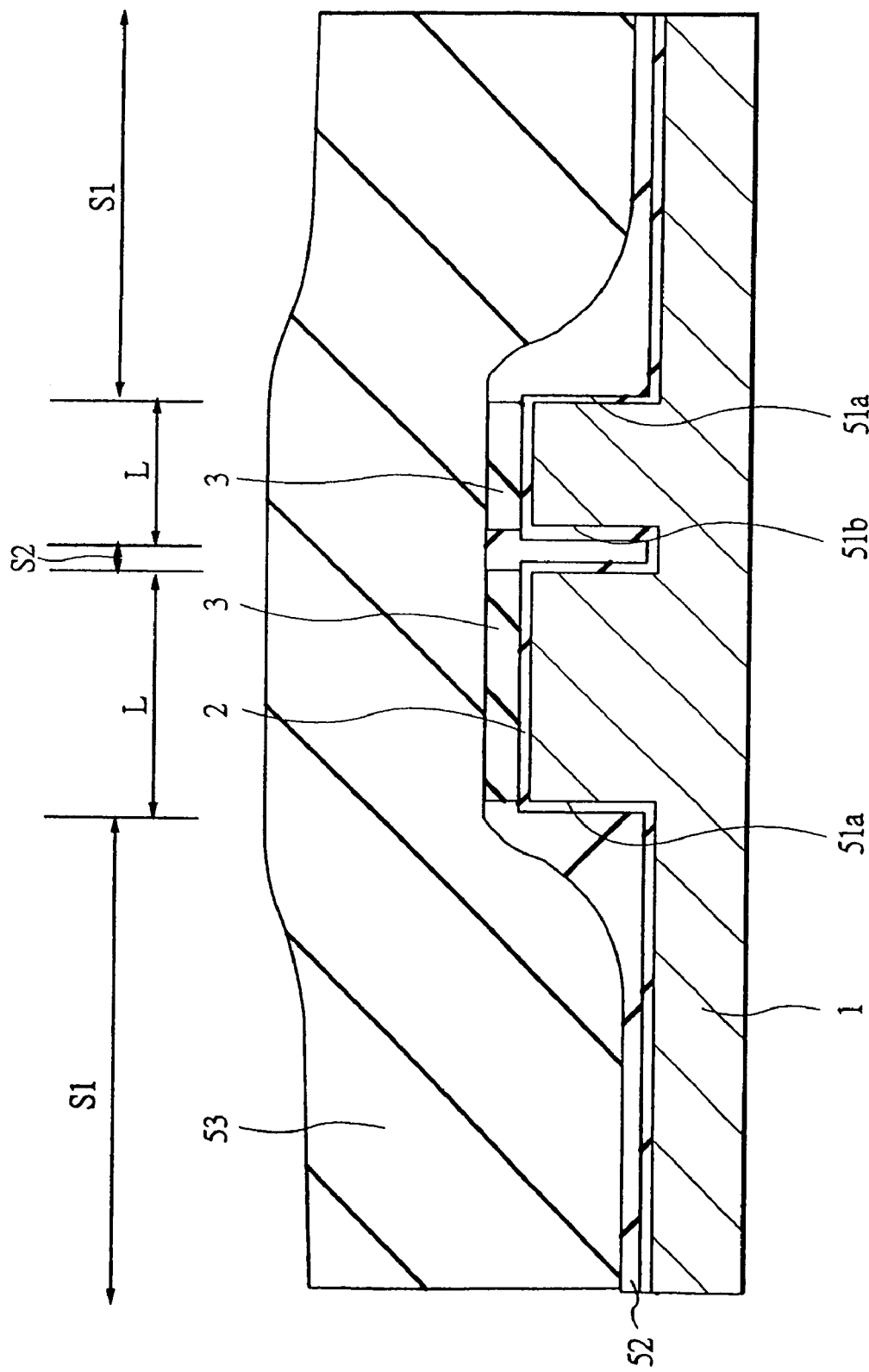
FIG. 35 is a sectional view of a semiconductor integrated circuit device during production illustrating technologies reviewed by the present inventor for making the present invention.

Before describing a second embodiment of the present invention, a problem found by the present inventor will be described with reference to FIG. 35. FIG. 35 shows a partial sectional view of a semiconductor substrate 50. FIG. 35 shows a case where there is a first isolation portion formed region SI with a relatively large planar area and a second isolation portion formed region S2 with relatively small planar area. The isolation trenches 51a and 51b are already formed in a semiconductor substrate 1 in the first and second isolation portion formed regions S1 and S2. Under this state, as described in the first embodiment of the present invention, an insulating film for isolation is deposited in two steps. That is, after a coating film 52 is deposited, an insulating film 53 is deposited sequentially from the bottom by the CVD method, for example. Thus, when the isolation trench 51a in the first isolation portion formed region SI with a larger planar area is filled with the coating film to some extent, the isolation trench 51b in the second isolation portion formed region S2 with a smaller planar area is filled completely thereby. When this happens, an isolation portion having the coating film 52 only is formed in the second isolation portion formed region S2. Conversely, when the isolation trench 51b in the second isolation portion formed region S2 is prevented from being filled completely, the thickness of the coating film 52 filled within the isolation trench 51a in the first isolation portion formed region SI gets thinner. As a result, the thickness of the insulating film 53 to be deposited thereon must be thicker. When the thickness of the insulating film 53 is thicker, a polishing amount of CMP for grating the insulating film 53 by CMP is increased. As a result, variations in the CMP polishing are caused.

Figure 29:
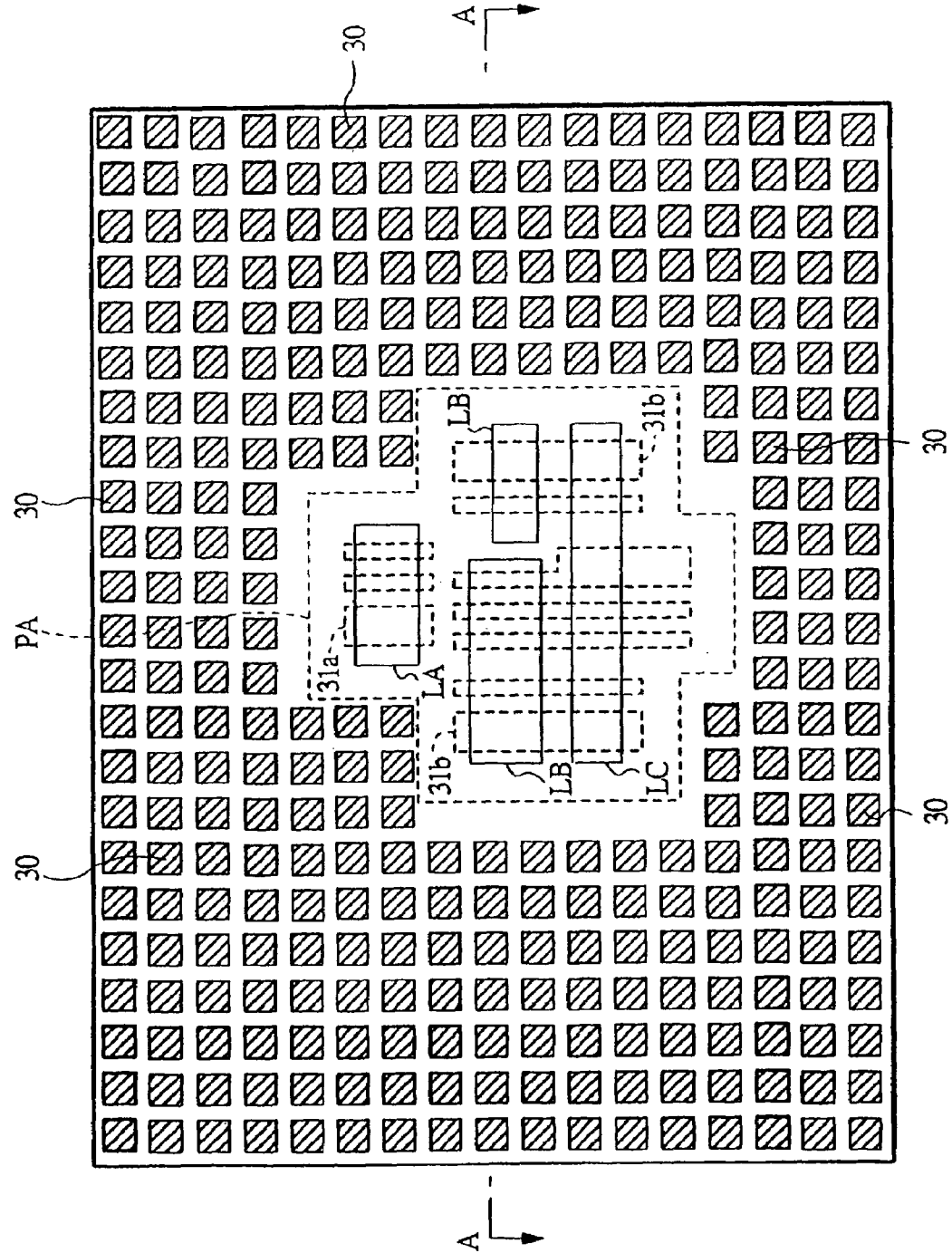
FIG. 29 is a top view of another embodiment of a semiconductor integrated circuit device during production according to the present invention.
Figure 30:
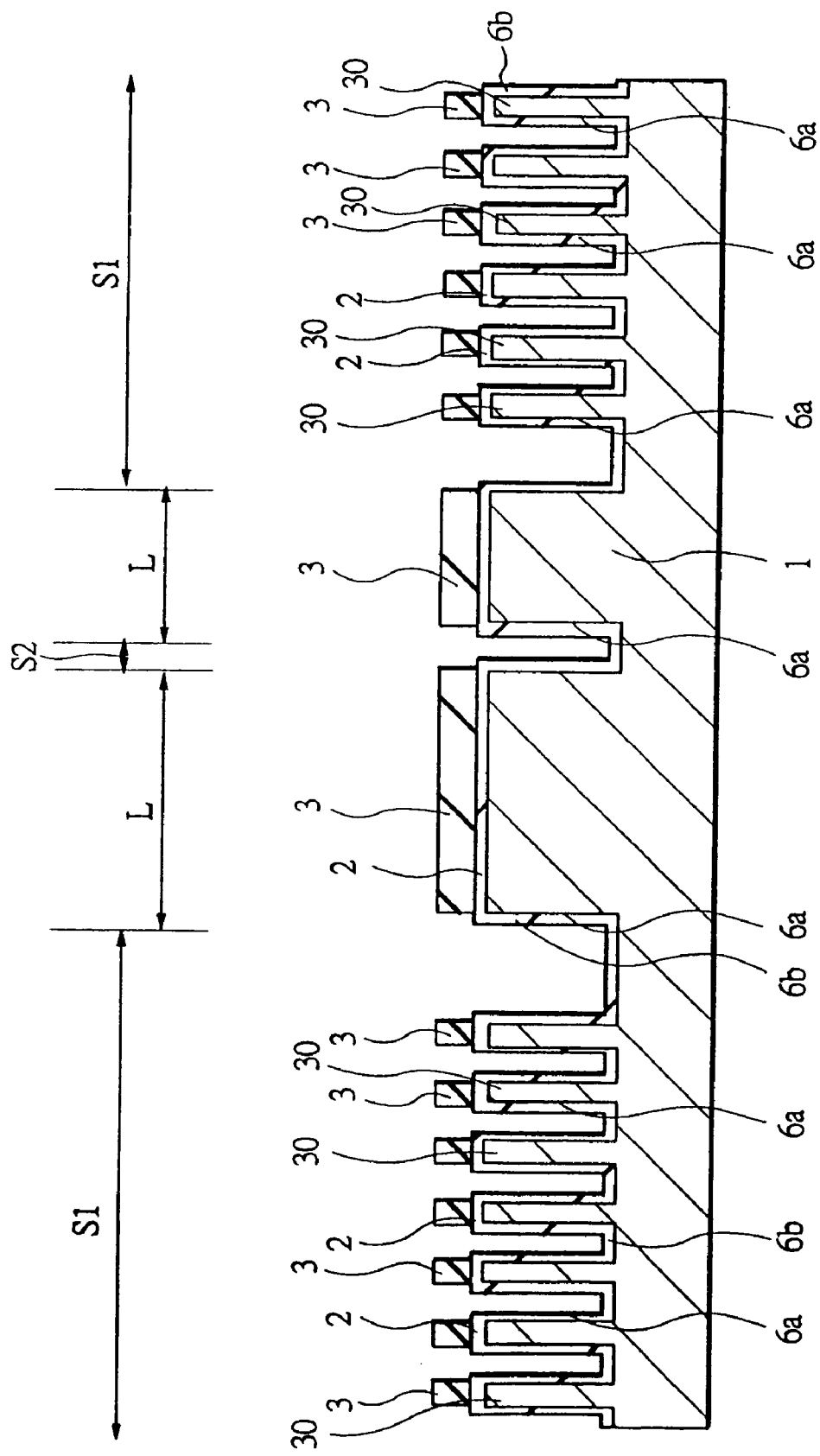
FIG. 30 is a sectional view taken on line A—A in FIG. 29.

Therefore, according to the second embodiment of the present invention, an arrangement will be described with reference to FIG. 29, which shows a plane view, during a process of manufacture, of a semiconductor integrated circuit device, and FIG. 30, which shows a sectional view taken on line A—A in FIG. 29. A first isolation portion formed region SI, with a relatively larger two-dimensional area, and a second isolation portion formed area S2, with a relatively small two-dimensional area, exist in a semiconductor substrate 1. An active region L is formed in an area surrounded by the first and the second isolation portion formed regions S1 and S2. The active region L (active regions LA, LB, LC) is located. in a dummy inhibited area DA. The dummy inhibited area DA is designed so as to prevent a dummy pattern described below from being located in the dummy inhibited area DA to which elements should be located. An n-well, for example, is formed and a pMIS is located in each of the active regions LA and LB. On the other hand, a p-well is formed and an nMIS is located in the active region LC. Gate electrodes 31a and 31b shown in dashed lines are patterns forming those MISFETs. The gate electrode 31a is located longitudinally across the active region LA. The gate electrode 31b is located longitudinally across the active regions LB and LC.

According to the second embodiment of the present invention, dummy patterns 30 are provided in the first isolation portion formed region SI with a relatively larger two-dimensional area. That is, in the first isolation portion formed region SI with a relatively larger two-dimensional area, an isolation trench 6a is formed between adjacent dummy patterns 30. The structure can suppress or prevent the thickness variations of the insulating film with which the isolation trench 6a is filled as described later. The dummy patterns 30 are formed by leaving the dummy patterns 30 when the isolation trench 6a is formed. That is, the dummy patterns 30 are formed with parts of the semiconductor substrate 1. A two-dimensional shape of the dummy pattern 30 is formed as a square, for example. That is, in the first isolation portion formed region SI, the isolation trench 6a is formed in a two-dimensional grid manner. Viewing the main surface of the semiconductor substrate 1 as a whole, and according to the second embodiment, the width of the isolation trench 6a formed between adjacent dummy patterns 30 in the first isolation portion formed region SI having the relatively larger two-dimensional area, for example, is substantially equal to the width of the isolation trench 6a in the second isolation portion formed region S2 having a relatively small two-dimensional area, for example (such as an isolation trench 6a with the smallest two-dimensional area, here). Thus, isolation trenches 6a with identical two-dimensional patterns are formed on the main surface of the semiconductor substrate 1 as a whole. Further, the depth of the isolation trench 6a is uniform in the first and the second isolation portion formed regions S1 and S2. This is for improving the uniformity of the thickness of the insulating film with which the isolation trench 6a is filled. The width and the depth of the isolation trench 6a are about 70 μm, for example, and about 500 nm, for example, respectively. The aspect ratio is not less than 7, for example. The isolation trenches 6a in the first and the second isolation portion formed regions are formed by the same method as the one described in the first embodiment during the same process. Forming them during the same process allows the dummy patterns 30 to be formed more easily. The insulating films 2 and 6b are formed on the surface of the semiconductor substrate 1, including dummy patterns 30, by the same methods as the one described for the first embodiment, respectively. Further, an insulating film 3 is formed on the insulating film 2 by the same method as the one described for the first embodiment.

Figure 31:
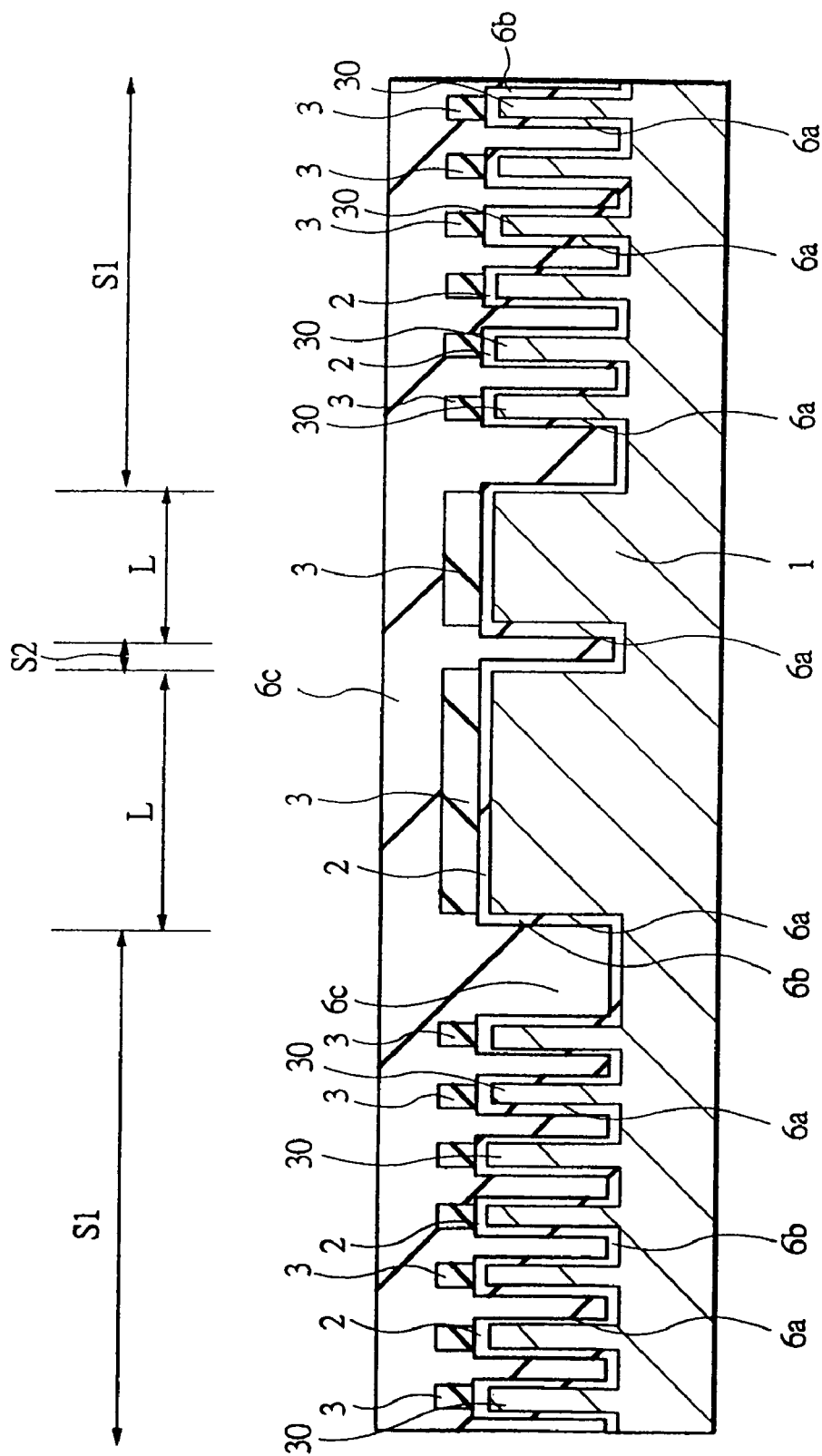
FIG. 31 is a sectional view of the semiconductor integrated circuit device, during a production step subsequent to that of FIG. 30 taken on line A—A in FIG. 29.
Figure 32:
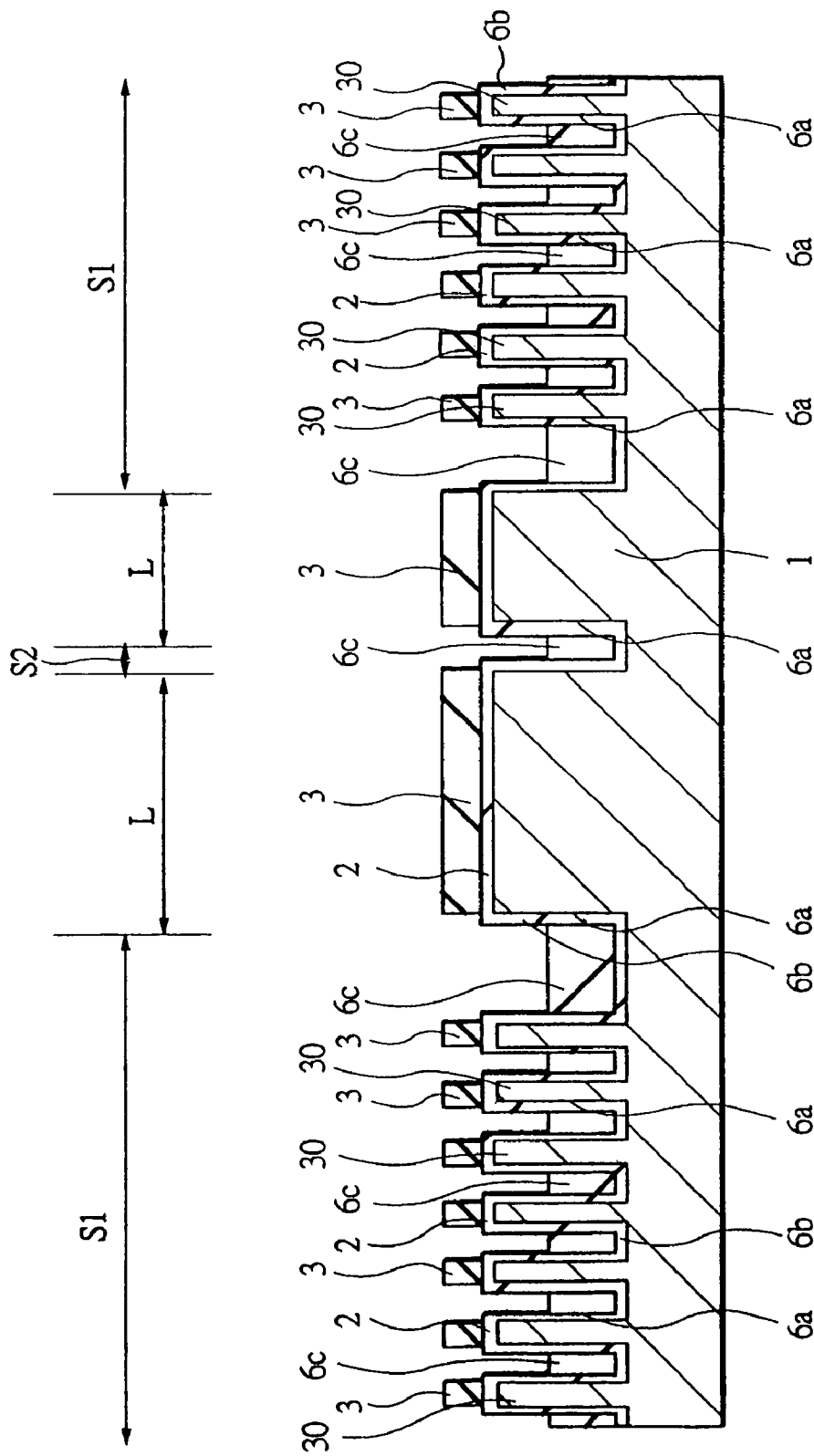
FIG. 32 is a sectional view of the semiconductor integrated circuit device, during a production step subsequent to that of FIG. 31 taken on line A—A in FIG. 29.

In the second embodiment of the present invention, as shown in FIG. 31, the isolation trench 6a is filled by depositing the coating film 6c on the main surface of the semiconductor substrate 1 in the same manner as for the first embodiment. Then, as shown in FIG. 32, the insulating film 3 is used as an etching mask to etch and remove the coating film 6c so as to leave a portion of the coating film 6c up to a predetermined middle position in the depth direction of the isolation trench 6a. As a result, the isolation trench 6a is made shallower. Here, a portion of the coating film 6c is left in the isolation trench 6a such that the depth of the isolation trench 6a is not more than about 210 nm, for example, that is, the aspect ratio is not more than 3. In the second embodiment, the dummy patterns 30 are provided in the first isolation portion formed region SI having the relatively large area so that the thicknesses, or heights, of the insulating film 6c left within the isolation trench 6a in the first isolation portion formed region SI having the relatively large area and the insulating film 6c left within the isolation trench 6a in the second isolation portion formed region S2 with the relatively small area can be substantially equal. That is, at this stage, the thickness of the insulating films 6c on the main surface of the semiconductor substrate 1 can be substantially equal.

Figure 33:
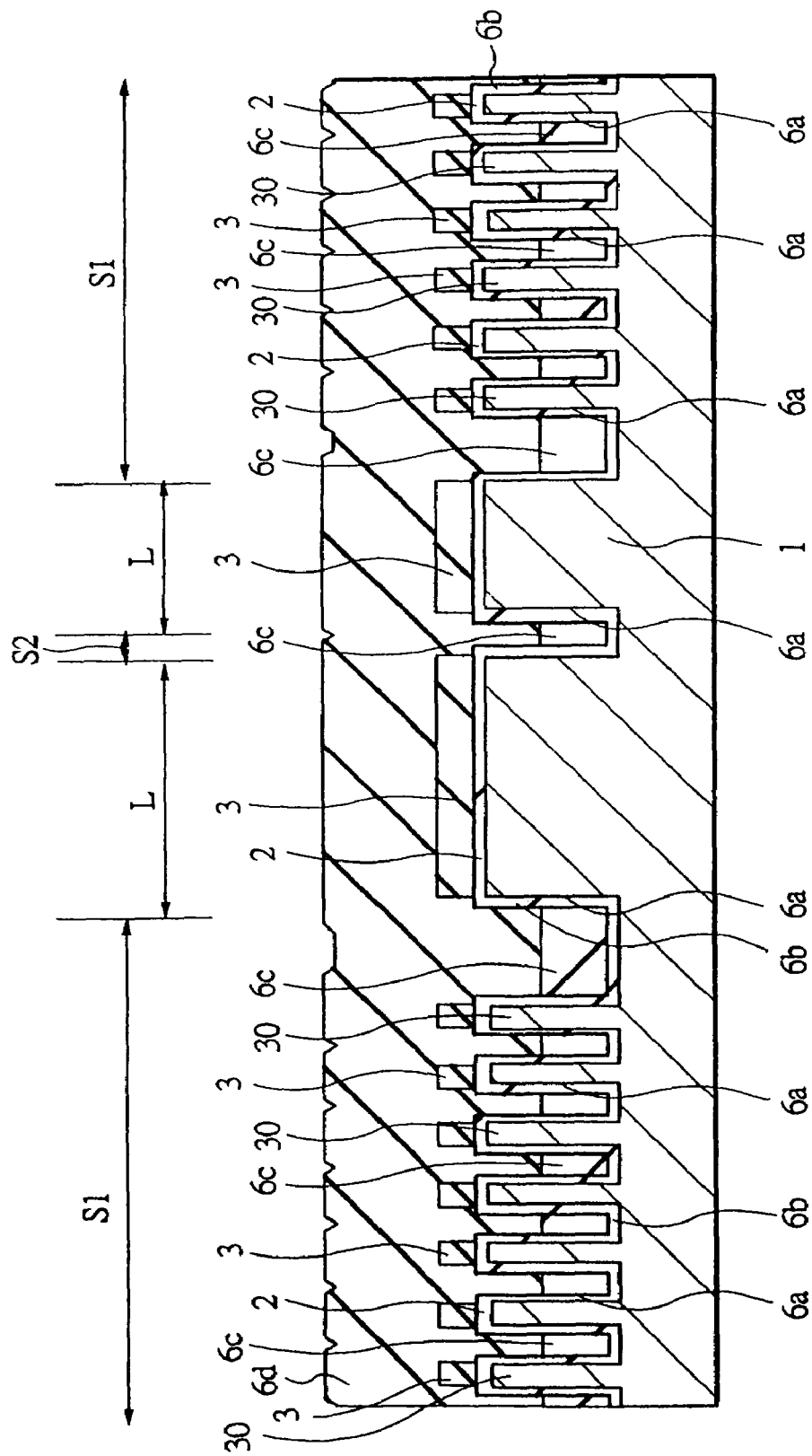
FIG. 33 is a sectional view of the semiconductor integrated circuit device, during a production step subsequent to that of FIG. 32 taken on line A—A in FIG. 29.

Subsequently, thermal processing at 800 □C for about one minute, for example, is performed on the semiconductor substrate 1 in a nitrogen gas atmosphere, for example. This can improve the quality of the coating film 6c. After the wet etching rate is reduced, as shown in FIG. 33, an insulating film 6d is deposited on the main surface of the semiconductor substrate 1 in the same manner as for the first embodiment in order to fill the remaining depth portion of the isolation trench 6a. Here, since the aspect ratio of the isolation trench 6a (remaining depth portion) is not more than 3, the isolation trench 6a can be filled such that no holes, voids or seams are formed in the insulating film 6d within the isolation trench 6a.

Furthermore, when the isolation trench 6a is deep, the main surface of the semiconductor substrate 1 gets more uneven. In addition, the main surface of the semiconductor substrate 1 can be uneven due to variations in thickness of the insulating film 6c when there are isolation regions with different two-dimensional areas relatively in the semiconductor substrate 1. In that case, the deposition thickness of the insulating film 6d must be thickened to some extent in order to prevent unevenness on the top surface of the insulating film 6d. However, in the second embodiment, the depth of the isolation trench 6a is reduced by using the coating film 6c in advance so that the unevenness on the main surface of the semiconductor substrate 1 can be reduced. Therefore, the deposition thickness of the insulating film 6d also can be reduced. Further, the dummy patterns 30 are provided in advance in the first isolation portion formed region S1 having a relatively large two-dimensional area so that the thickness of the insulating film 6c filled in the isolation trench 6a can be uniform regardless of a difference between the two dimensional area sizes of the isolation portion formed regions (the first and the second isolation portion formed regions S1 and S2, for example). Therefore, the thickness of the insulating film 6d can be relatively thin.

Figure 34:
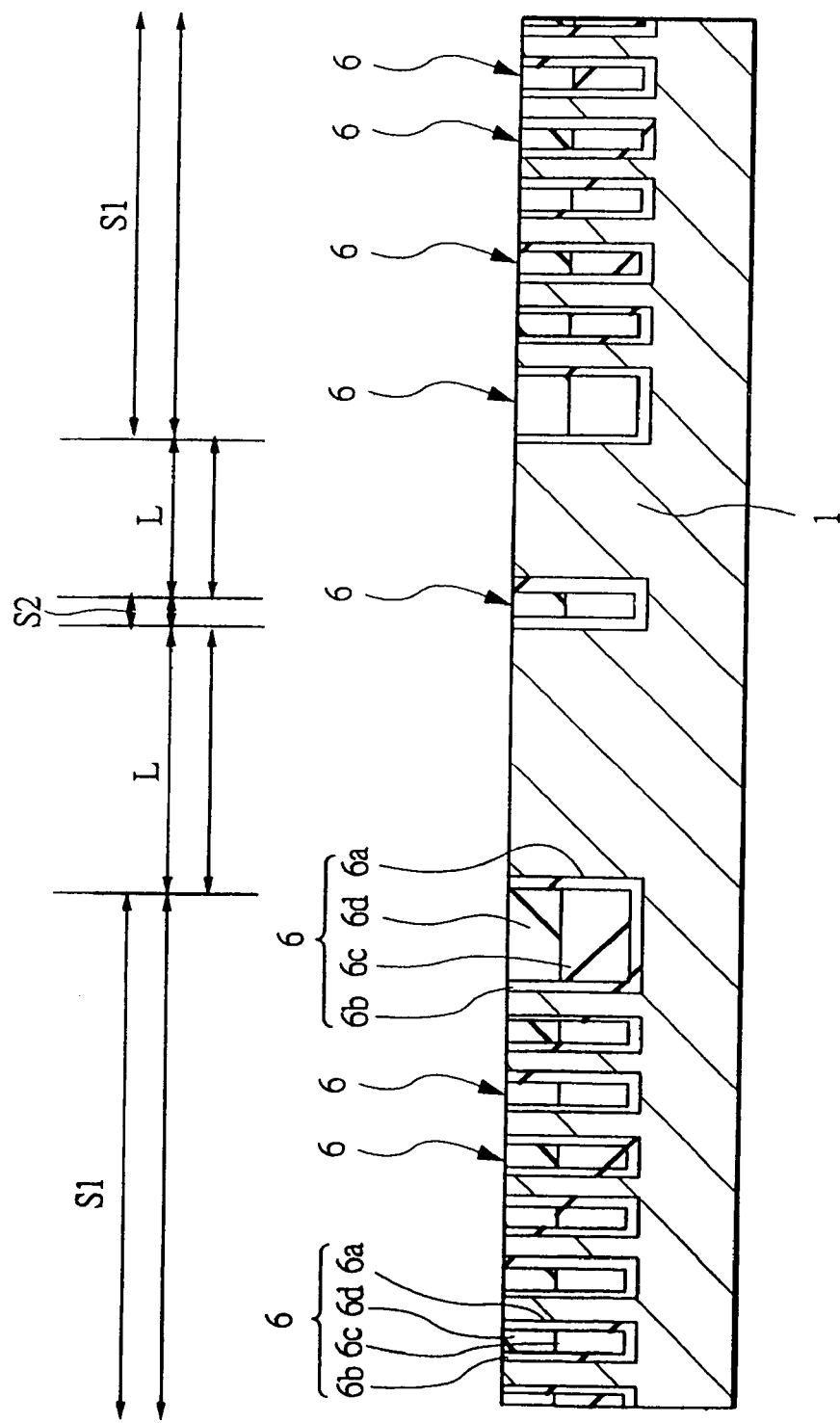
FIG. 34 is a sectional view of the semiconductor integrated circuit device, during a production step subsequent to that of FIG. 32 taken on line A—A in FIG. 29.

Next, as shown in FIG. 34, the insulating film 3 is used as an etching stopper to polish the insulating films 6d by the CMP method. Here, also in the second embodiment, the deposition thickness of the insulating film 6d can be thinner as described above. Thus, the amount of polishing of the insulating films 6d by CMP can be reduced, which can reduce polishing variations produced by CMP. Then, etching processing is performed on the semiconductor substrate 1 in order to etch and remove the insulating films 2 and 3. As a result, the isolation portions 6 with a trench filled structure are formed. By forming the isolation portions 6, active regions L with a long and narrow island-shaped pattern surrounded by the isolation portion 6 are formed at the same time. The top surface of the isolation portion 6, that is, the top surface of the insulating film 6d is flattened like the first embodiment so as to be at substantially the same level with the top surface of the active region L. No holes, voids and seams are formed at the top surface of the insulating film 6d.

Third Embodiment

Figure 36:
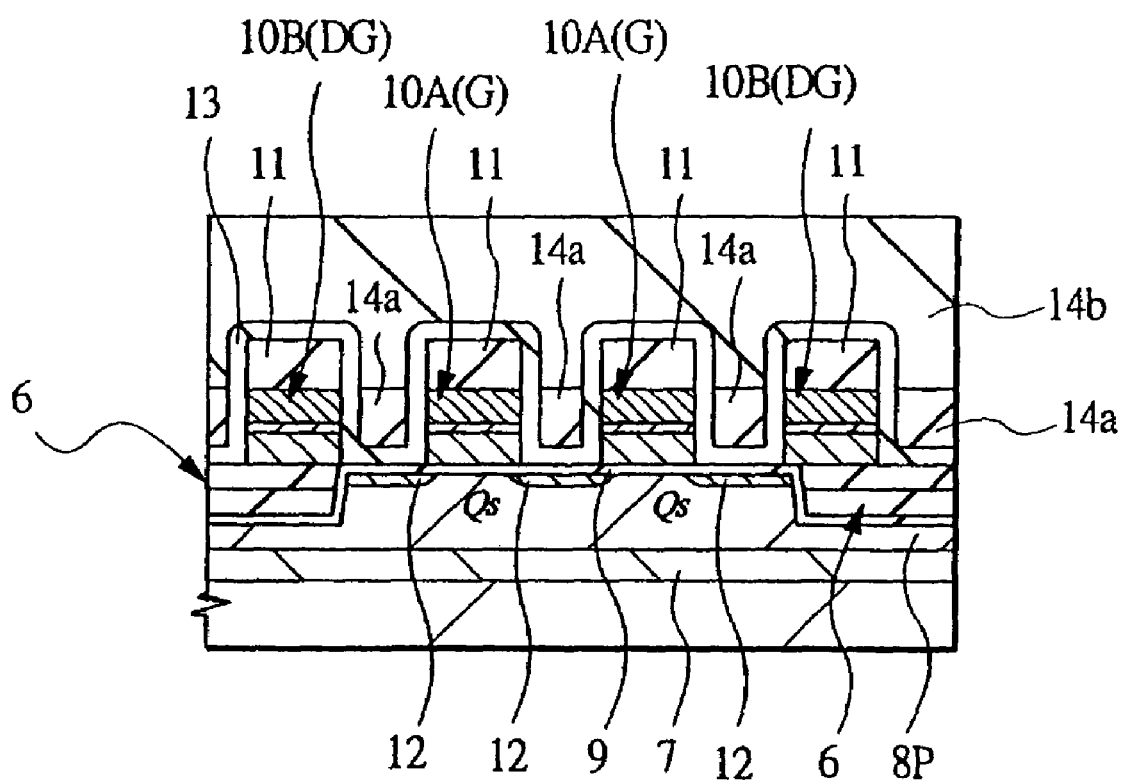
FIG. 36 is a sectional view of another embodiment of a semiconductor integrated circuit device during production according to the present invention.

As shown in FIG. 36, dummy gate electrodes 10B (DG) are provided in a third embodiment, which are in the same layer as the gate electrodes 10A (G) in the first and second embodiments. Thus, the thickness of coating films 14a on the main surface of the semiconductor substrate 1 can be substantially uniform. As a result, the deposition thickness of the insulating film 14b is reduced so that the amount of polishing by the CMP method can be reduced. Here, the dummy gate electrodes 10B (DG) can be arranged in the same manner as the dummy patterns 30 in the second embodiment. The dummy gate electrodes 10B (DG) can be formed into the same structure as that of the gate electrodes 10A by changing the mask pattern of the photo-resist film for forming the gate electrodes 10A in the first and second embodiments.

A method of manufacturing the semiconductor integrated circuit device according to the third embodiment includes the steps of (a) forming a plurality of patterns, including gate electrodes 10A and dummy gate electrodes 10B of MIS-FETQs and, arranged adjacent to each other on a semiconductor substrate; (b) filling a trench formed between the plurality of patterns adjacent to each other up to a predetermined middle position in its depth direction with a first insulating film 14a deposited by a coating method; and (c) filling a remaining depth portion of the trench into which the first insulating film 14a has been filled with a second insulating film 14b.

In the method of manufacturing the semiconductor integrated circuit device described above, the second insulating film is deposited by the chemical vapor deposition method.

As described above, the present invention has been described specifically based on the various embodiments. However, the present invention is not limited to the first, second and third embodiments and can be changed in various manners without departing from its principle.

For example, while the first, second and third embodiments describe a case where the semiconductor substrate has a simple structure with silicon single crystal, the present invention is not limited to such case and can be changed in various ways. For example, it may include an epitaxial wafer in which an epitaxial layer is formed on a surface of a silicon-on-insulator (SOI) substrate or a semiconductor substrate to which a semiconductor layer for forming elements on an insulating layer is provided.

While, in the first, second and third embodiments, the coating film is etched back so as to be left within the isolation trench, no limitation to this technique is intended. For example, the coating film may be coated so as to fill only a bottom portion of the isolation trench up to a predetermined middle depth when coating the coating film. In this case, the etch-back step can be eliminated, the process can be simplified. Further, since variations by the etch-back processing can be eliminated. Thus, total variations in manufacturing the semiconductor integrated circuit device can be reduced. Accordingly, the yield and reliability of the semiconductor integrated circuit device can be improved.

While the description has been given of a case where the present invention is applied to a DRAM, which is the background application field of the present invention, no limitation is intended. The present invention may be applied to a semiconductor device having a memory circuit, such as a static random access memory (SRAM) and a flash memory (electric erasable programmable read only memory: EEPROM), or to a semiconductor device having a logic circuit, such as a microprocessor. Alternatively, it may be applied to a hybrid semiconductor device including both a memory circuit and a logic circuit on an identical semiconductor substrate. Furthermore, it may be applied to technology for manufacturing a semiconductor integrated circuit device manufactured on another insulating substrate, such as the glass of a tin-film-transistor (TFT) and super-twisted-nematic (STN) liquid crystal, for example.

Typical effects obtained by the present invention disclosed herein may be described simply as follows:

(1) According to the present invention, no holes and the like are formed at a top portion of an insulating film to be filled within an isolation trench so that the isolation trench can be filled well with the insulating film.

(2) According to the present invention, no holes and the like are formed at a top portion of an insulating film to be filled within a trench between adjacent patterns so that the trench can be filled well with the insulating film.

(3) According to (1) and (2) above, a short circuit failure between electrode wires can be prevented.

(4) According to the present invention, the thickness of an insulating film to be filled in the isolation trench can be reduced so that the amount of polishing of the insulating film can be reduced. Therefore, variations in polishing the insulating film can be reduced.

(5) According to the present invention, dummy patterns are provided in an isolation portion formed region having a relatively large two-dimensional area so that the thicknesses of an insulating film formed by a coating method and an insulating film formed by a chemical vapor deposition method can be uniform and reduced. As a result, the amount of polishing of the insulating film formed by the chemical vapor deposition method can be reduced. Therefore, variations in polishing the insulating film can be reduced.

(6) According to (3), (4) and (5), the reliability of a semiconductor integrated circuit device can be enhanced.

(7) According to (3), (4) and (5), the yield of a semiconductor integrated circuit device can be enhanced.

What is claimed is:

1. A method for manufacturing a semiconductor integrated circuit device, comprising the steps of:
   (a) forming an isolation trench in an isolation region of a semiconductor substrate;
   (b) forming a spin-on-glass film in said isolation trench by a coating method so as to cover a bottom of said isolation trench;
   (c) etching said spin-on-glass film up to a predetermined position in a depth direction of said isolation trench;
   (d) performing thermal processing on said semiconductor substrate; and
   (e) filling a remaining depth portion of said isolation trench with an insulating film,
   wherein an etching rate of said insulating film is lower than that of said spin-on-glass film.

2. A method for manufacturing a semiconductor integrated circuit device according to claim 1, wherein said insulating film is filled into said remaining depth portion of said isolation trench by a chemical vapor deposition method.

3. A method for manufacturing a semiconductor integrated circuit device according to claim 1, wherein said step (e) comprises the step of depositing said insulating film on a main surface of said semiconductor substrate, and further comprising the step of polishing said insulating film on the main surface of said semiconductor substrate by a chemical mechanical polishing method after said depositing step.

4. A method for manufacturing a semiconductor integrated circuit device according to claim 1, wherein said etching rate is a wet-etching rate.

5. A method for manufacturing a semiconductor integrated circuit device according to claim 1, wherein said step (b) comprises the step of depositing said spin-on-glass film on a main surface of said semiconductor substrate by a rotary coating method such that the deposited spin-on-glass film has a planarized surface.

6. A method for manufacturing a semiconductor integrated circuit device according to claim 1, wherein said spin-on-glass film has liquidity with a 100 mPa·s or lower viscosity coefficient at a temperature of 25° C.

7. A method for manufacturing a semiconductor integrated circuit device, comprising the steps of:
   (a) forming an isolation trench in an isolation region of a semiconductor substrate;
   (b) filling said isolation trench with a spin-on-glass film coated by a coating method;
   (c) etching said spin-on-glass film up to a predetermined position in a depth direction of said isolation trench;
   (d) performing thermal processing on said semiconductor substrate after said step (c);
   (e) depositing an insulating film on a main surface of said semiconductor substrate by a chemical vapor deposition method so as to fill a remaining depth portion of said isolation trench; and
   (f) polishing said insulating film on said main surface of said semiconductor substrate by a chemical mechanical polishing method,
   wherein said insulating film is more difficult to be etched than said spin-on-glass film.

8. A method for manufacturing a semiconductor integrated circuit device according to claim 7, wherein said spin-on-glass film includes polysilazane.

9. A method for manufacturing a semiconductor integrated circuit device according to claim 7, wherein said spin-on-glass film is an inorganic spin-on-glass film.

10. A method for manufacturing a semiconductor integrated circuit device according to claim 7, wherein said step (b) comprises the step of coating said spin-on-glass film on a main surface of said semiconductor substrate by a rotary coating method such that the coated spin-on-glass film has a planarized surface.

11. A method for manufacturing a semiconductor integrated circuit device according to claim 7, wherein said spin-on-glass film has liquidity with a 100 mPa·s or lower viscosity coefficient at a temperature of 25° C.

12. A method for manufacturing a semiconductor integrated circuit device, comprising the steps of:
   (a) forming an isolation trench in an isolation region of a semiconductor substrate;
   (b) filling said isolation trench with a spin-on-glass film coated by a coating method;
   (c) etching said spin-on-glass film up to a predetermined position in a depth direction of said isolation trench;
   (d) performing thermal processing on said semiconductor substrate after said step (c), wherein said step (d) is a step for improving a film quality of said spin-on-glass film;
   (e) depositing an insulating film on a main surface of said semiconductor substrate by a chemical vapor deposition method so as to fill a remaining depth portion of said isolation trench; and
   (f) polishing said insulating film on said main surface of said semiconductor substrate by a chemical mechanical polishing method.

13. A method for manufacturing a semiconductor integrated circuit device, comprising the steps of:
   (a) forming an isolation trench in an isolation region of a semiconductor substrate;
   (b) filling said isolation trench with a spin-on-glass film coated by a coating method;
   (c) etching said spin-on-glass film up to a predetermined position in a depth direction of said isolation trench;
   (d) performing thermal processing on said semiconductor substrate after said step (c), wherein said step (d) is a step for reducing a wet-etching rate of said spin-on-glass film;
   (e) depositing an insulating film on a main surface of said semiconductor substrate by a chemical vapor deposition method so as to fill a remaining depth portion of said isolation trench; and
   (f) polishing said insulating film on said main surface of said semiconductor substrate by a chemical mechanical polishing method.

* * * * *